US012649757B2

(12) United States Patent
Ryu et al.

(10) Patent No.: US 12,649,757 B2
(45) Date of Patent: Jun. 9, 2026

(54) MATERIALS FOR FABRICATING THIN FILMS, METHODS OF FABRICATING THIN FILMS USING THE SAME, AND EQUIPMENT FOR FABRICATING THIN FILMS USING THE SAME

(71) Applicants: Samsung Electronics Co., Ltd., Suwon-si (KR); ADEKA CORPORATION, Tokyo (JP)

(72) Inventors: Seung-Min Ryu, Hwaseong-si (KR); Gyu-Hee Park, Hwaseong-si (KR); Youn Joung Cho, Hwaseong-si (KR); Kazuki Harano, Tokyo (JP); Takanori Koide, Tokyo (JP); Wakana Fuse, Tokyo (JP); Yoshiki Manabe, Tokyo (JP); Yutaro Aoki, Tokyo (JP); Hiroyuki Uchiuzou, Tokyo (JP); Kazuya Saito, Tokyo (JP)

(73) Assignees: Samsung Electronics Co., Ltd., Suwon-si (KR); Adeka Corporation, Tokyo (JP)

( * ) Notice: Subject to any disclaimer, the term of this patent is extended or adjusted under 35 U.S.C. 154(b) by 960 days.

(21) Appl. No.: 17/215,056

(22) Filed: Mar. 29, 2021

(65) Prior Publication Data

US 2021/0380622 A1 Dec. 9, 2021

(30) Foreign Application Priority Data

Jun. 4, 2020 (KR) ........................ 10-2020-0067726

(51) Int. Cl.
*C07F 17/00* (2006.01)
*C23C 16/18* (2006.01)
*C23C 16/455* (2006.01)

(52) U.S. Cl.
CPC .............. *C07F 17/00* (2013.01); *C23C 16/18* (2013.01); *C23C 16/45553* (2013.01)

(58) Field of Classification Search
CPC ................................ C07F 17/00; C23C 16/18
See application file for complete search history.

(56) References Cited

U.S. PATENT DOCUMENTS 6,126,996 A 10/2000 Kirlin et al.
6,890,876 B2 5/2005 Mccullough et al.
(Continued)

FOREIGN PATENT DOCUMENTS

JP 5275243 B2 8/2013
WO WO 2020/247237 * 12/2020
WO WO-2022019712 A1 * 1/2022 ................ C07F 9/00

OTHER PUBLICATIONS

Chernega et al; Bis(cyclopentadienyl)imido compounds of niobium; J. Chem. Soc. Dalton Trans, pp. 3031-3034 (Year: 1993).*
(Continued)

*Primary Examiner* — Robert S Walters, Jr.
(74) *Attorney, Agent, or Firm* — Wolf, Greenfield & Sacks, P.C.

(57) ABSTRACT

Materials for fabricating a thin film that has improved quality and productivity are provided. The materials may include a Group 5 element precursor of formula (1):
(Continued)

(1)

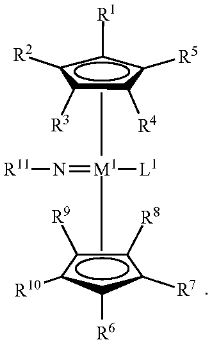

$M^1$ may be a Group 5 element, each of $R^1$ to $R^{10}$ independently ay be a hydrogen atom, a substituted or unsubstituted alkyl group having 1 to 5 carbon atoms, or formula (2), $R^{11}$ may be a substituted or unsubstituted alkyl group having 1 to 10 carbon atoms, and $L^1$ may be an alkyl group, an alkylamino group, an alkoxy group or an alkylsilyl group, each of which may have 1 to 5 carbon atoms and may be substituted or unsubstituted. Formula (2) may have a structure of (2)

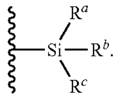

Each of $R^a$ to $R^c$ independently may be a substituted or unsubstituted alkyl group having 1 to 5 carbon atoms.

15 Claims, 5 Drawing Sheets

(56) References Cited

U.S. PATENT DOCUMENTS

| | | | |
|---|---|---|---|
| 7,956,207 B2 | 6/2011 | Meiere et al. | |
| 8,491,967 B2 | 7/2013 | Ma et al. | |
| 8,962,875 B2 | 2/2015 | Norman et al. | |
| 2007/0190249 A1 | 8/2007 | Hosokawa et al. | |
| 2008/0026576 A1 | 1/2008 | Shenai-Khatkhate et al. | |
| 2008/0102205 A1 * | 5/2008 | Barry | C23C 16/513 427/250 |
| 2017/0178961 A1 * | 6/2017 | Ryu | C23C 16/45525 |

OTHER PUBLICATIONS

English machine translation of WO 2022/019712.*

Schmidt, Simone, et al., "High valence derivatives of d-metal acids", Journal of Organometallic Chemistry, 472, 1994, 127-138 (25 pages, including English translation).

Journal of Organometallic Chemistry, 472 (1994) 127-138 High valence derivatives of d-metal acids X*. Imido complexes of pentavalent and tetravalent niobium and tantalum with a half-sandwich and metallocene structure ** Simone Schmidt and JÃ¶rg Sundermeyer Institut fÃ¼r Anorganische Chemie der UniversitÃ¤t, Am Hubland, D-97074 Wiirzburg (Deutschland).†

Journal of the Chemical Society, Dalton Transaction Synthesis and reactions of (tert-butylimbido) bis(Î-cyclopentadienyl)niobium cations: NMR evidence for d0oelfincations [Nb[(Î-C5H5)]-(NtBu) (ÎC2H4)][B(C6F5)4]Martin J. Humphries, Richard E. Douthwaite and Malcolm L. H. Green Inorganic Chemistry Laboratory, South Parks Road, OXford, UK 0x1 3QR Received May 22, 2000, Acepted Jul. 5, 2000 Published on the Web Aug. 9, 2000 https://pubs.rs.org/en/content/articlelanding/2000/DT/b004062m.†

Journal of the Chemical Society, Dalton Transactions 1993 Bis(Î—cyclopentadienyl)imido compounds of niobium Alexander M. Chernega. Malcolm L. H. Green and Alejandra G. Suarez Inorganic Chemistry Laboratory, South Parks Road, Oxford OX1 30QR, UK https://pubs.rsc.org/en/content/articlelanding/1993/DT/DT9930003031.†

* cited by examiner
† cited by third party

MATERIALS FOR FABRICATING THIN FILMS, METHODS OF FABRICATING THIN FILMS USING THE SAME, AND EQUIPMENT FOR FABRICATING THIN FILMS USING THE SAME

CROSS-REFERENCE TO RELATED APPLICATION

This U.S. non-provisional patent application claims priority under 35 U.S.C. § 119 to Korean Patent Application No. 10-2020-0067726, filed on Jun. 4, 2020, in the Korean Intellectual Property Office, the disclosure of which is hereby incorporated by reference in its entirety.

FIELD

The present disclosure generally relates to the field of electronics and, more particularly, to a material for fabricating a thin film, a method for fabricating the thin film using the same, and equipment for fabricating the thin film using the same.

BACKGROUND

A thin film including a Group 5 element (for example, vanadium (V), niobium (Nb) or tantalum (Ta)) may be used as a high-dielectric constant material of a semiconductor device (for example, a capacitor of a DRAM or the like). A method for fabricating a thin film may include sputtering, ion plating, a thermal decomposition method a sol-gel method, a metal-organic deposition (MOD) method, a chemical vapor deposition (CVD) method, an atomic layer deposition (ALD) method and the like.

Various materials have been reported as sources of Group 5 elements. For example, niobium (Nb) precursors and tantalum (Ta) precursors have been reported.

SUMMARY

Aspects of the present disclosure provide materials for fabricating a thin film capable of fabricating a thin film having improved quality and productivity, by including a Group 5 element precursor having a low melting point and excellent thermal stability.

Aspects of the present disclosure also provide methods of fabricating a thin film having improved quality and productivity using a material for fabricating a thin film having a low melting point and excellent thermal stability.

Aspects of the present disclosure also provide equipment that can be used for fabricating a thin film having improved quality and productivity using a material for fabricating a thin film having a low melting point and excellent thermal stability.

However, aspects of the present disclosure are not limited to those set forth herein. The above and other aspects of the present disclosure will become more apparent to one of ordinary skill in the art to which the present disclosure pertains by referencing the detailed description provided herein.

According to some embodiments of the present inventive concept, materials for fabricating a thin film may include a Group 5 element precursor of formula (1).

(1)

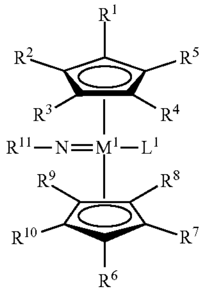

In formula (1), $M^1$ may be a Group 5 element, each of $R^1$ to $R^{10}$ independently may be a hydrogen atom, formula (2), or a substituted (e.g., substituted with halogen atom(s)) or unsubstituted alkyl group having 1 to 5 carbon atoms, $R^{11}$ may be a substituted or unsubstituted alkyl group having 1 to 10 carbon atoms, and $L^1$ may be an alkyl group, an alkylamino group, an alkoxy group or an alkylsilyl group, each of which may have 1 to 5 carbon atoms and may be substituted or unsubstituted.

(2)

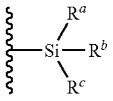

Each of $R^a$ to $R^c$ independently may be a substituted or unsubstituted alkyl group having 1 to 5 carbon atoms.

According to some embodiments of the present inventive concept, materials for fabricating a thin film may include a Group 5 element precursor of formula (1).

(1)

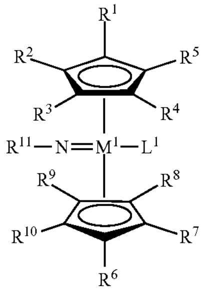

In formula (1), $M^1$ may be a Group 5 element, all of $R^1$ to $R^{10}$ m y be hydrogen atoms or methyl groups, $R^{11}$ may be an isopropyl group, a sec-butyl group, a tert-butyl group or a tert-pentyl group, and $L^1$ may be a substituted or unsubstituted alkyl group having 1 to 5 carbon atoms or may have a structure of formula (2), formula (3) or formula (4).

(2)

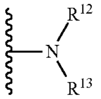

-continued (3)

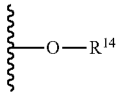

(4)

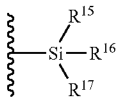

$R^{12}$ to $R^{17}$ each independently may be a substituted or unsubstituted alkyl group having 1 to 5 carbon atoms.

According to some embodiments of the present inventive concept, methods of fabricating a thin film may include providing a material including a Group 5 element precursor of formula (1) onto a substrate, and forming a thin film including a Group 5 element on the substrate using the material.

(1)

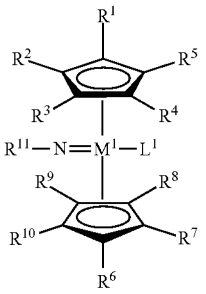

In formula (1), $M^1$ may be a Group 5 element, each of $R^1$ to $R^{10}$ independently may be a hydrogen atom, an alkyl group or an alkylsilyl group. Each of the alkyl group and the alkylsilyl group may have 1 to 5 carbon atoms and may be substituted (e.g., substituted with halogen atom(s)) or unsubstituted, $R^{11}$ may be a substituted or unsubstituted alkyl group having 1 to 10 carbon atoms, and $L^1$ may be an alkyl group, an alkylamino group, an alkoxy group or an alkylsilyl group, each of which may have 1 to 5 carbon atoms and may be substituted or unsubstituted.

DETAILED DESCRIPTION

Figure 1:
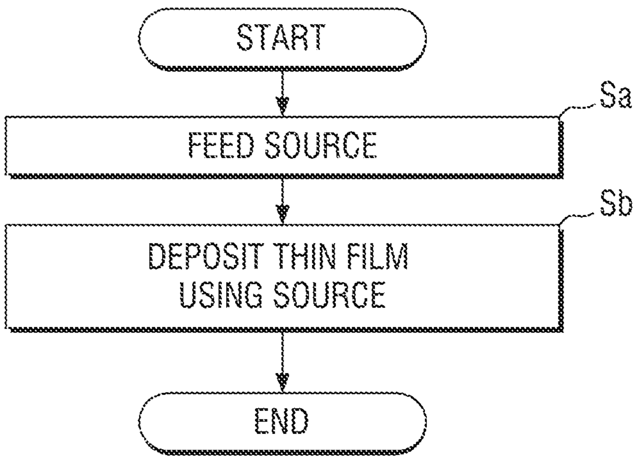
FIG. 1 is a flowchart for a method of fabricating a thin film according to some embodiments of the present inventive concept.

Hereinafter, a material (e.g., a compound) for fabricating a thin film according to some embodiments of the present inventive concept will be described with reference to examples, fabricating examples, and Comparative examples. However, these are merely examples, and the technical idea of the present disclosure is not limited to these examples.

The material for fabricating the thin film according to some embodiments may include a Group 5 element precursor of the following general formula (1).

(1)

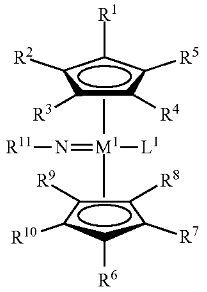

In the aforementioned general formula (1), $M^1$ may be a Group 5 element. For example, $M^1$ may be vanadium (V), niobium (Nb) or tantalum (Ta). Preferably, in some embodiments, $M^1$ may be a niobium (Nb) atom or a tantalum (Ta) atom. More preferably, in some embodiments, $M^1$ may be niobium (Nb). In such a case, the material for fabricating the thin film according to some embodiments may have excellent thermal stability and may form a thin film of high quality with a high yield.

In the aforementioned general formula (1), each of $R^1$ to $R^{10}$ independently may be a hydrogen (H) atom, an alkyl group or an alkylsilyl group. Each of the alkyl group and the alkylsilyl group may have 1 to 5 carbon atoms and may be substituted or unsubstituted. A substituted alkyl group and a substituted alkylsilyl group used herein refer to an alkyl group and an alkylsilyl group including at least one substituent substituting hydrogen atom(s) thereof. The substituent may be a halogen atom. In some embodiments, some or all of the hydrogen atoms of the alkyl group having 1 to 5 carbon atoms may be replaced/substituted with fluorine (F) atoms. The alkylsilyl group may be, for example, following general formula (2).

(2)

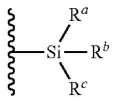

In the aforementioned general formula (2), each of $R^a$ to $R^c$ independently may be a substituted or unsubstituted alkyl group having 1 to 5 carbon atoms. The alkyl group having 1 to 5 carbon atoms may be, for example, the alkyl group having 1 to 5 carbon atoms exemplified above. In some embodiments, some or all of the hydrogen atoms of the alkyl group having 1 to 5 carbon atoms may be replaced/substituted with fluorine (F) atoms.

In some examples, $R^1$ may be an alkyl group having 1 to 5 carbon atoms, and each of $R^2$ to $R^{10}$ may be a hydrogen atom. Preferably, in some embodiments, $R^1$ may be a methyl group or an ethyl group, and each of $R^2$ to $R^{10}$ may be a hydrogen atom. In such a case, the material for fabricating the thin film according to some embodiments may have a low melting point and may be provided as a liquid to facilitate transportation.

In some embodiments, each of $R^1$ and $R^6$ may be an alkyl group having 1 to 5 carbon atoms, and each of $R^2$ to $R^5$ and $R^7$ to $R^{10}$ may be a hydrogen atom. Preferably, each of $R^1$ and $R^6$ may be a methyl group or an ethyl group, and each of $R^2$ to $R^5$ and $R^7$ to $R^{10}$ may be a hydrogen atom. In such a case, the material for fabricating the thin film according to some embodiments may have a low melting point and may be provided as a liquid to facilitate transportation.

In the aforementioned general formula (1), $R^{11}$ may be a substituted or unsubstituted alkyl group having 1 to 10 carbon atoms. The alkyl group having 1 to 0 carbon atoms may be, for example, an alkyl group having 1 to 5 carbon atoms exemplified above, Neopentyl group, a sec-Pentyl group, a tert-Pentyl group, a n-Heptyl group, a n-Nonyl group, a n-Decyl group, a tetra-Methylbutyl group or the like. In some embodiments, some or all of the hydrogen atoms of an alkyl group having 1 to 10 carbon atoms may be replaced/substituted with fluorine (F) atoms.

In some embodiments, $R^{11}$ may be a sec-Alkyl group or a tert-Alkyl group. Preferably, in some embodiments, $R^{11}$ may be an Isopropyl group, an Isobutyl group, a sec-Butyl group, a tert-Butyl group, an Isopentyl group, a sec-Pentyl group or a tert-Pentyl group. More preferably, in some embodiments, $R^{11}$ may be a tert-Butyl group or a tert-Pentyl group. In such a case, the material for fabricating the thin film according to some embodiments may have excellent thermal stability and may form a high quality thin film with a high yield.

In some embodiments, $R^1$ to $R^{10}$ may be all hydrogen atoms or Methyl group, and $R^{11}$ may be an Isopropyl group, a sec-Butyl group, a tert-Butyl group or a tert-Pentyl group. In such a case, the material for fabricating the thin film according to some embodiments may have a low melting point and may be provided as a liquid to facilitate transportation.

In the aforementioned general formula (1), $L^1$ may be an alkyl group, an alkylamino group, an alkoxy group or an alkylsilyl group, each of which may have 1 to 5 carbon atoms and may be substituted or unsubstituted. A substituted alkylamino group and a substituted alkoxy group used herein refer to functional groups (i.e., an alkylamino group and an alkoxy group) including at least one substituent substituting hydrogen atom(s) thereof. The substituent may be a halogen atom. For example, $L^1$ may be a substituted or unsubstituted alkyl group having 1 to 5 carbon atoms, or may have a structure of following general formula (3), following general formula (4) or following general formula (5).

(3)

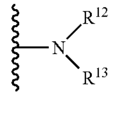

(4)

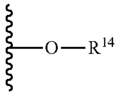

(5)

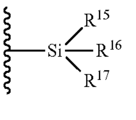

In the general formula (3), the general formula (4) and the general formula (5), each of $R^{12}$ to $R^{17}$ independently may be a substituted or unsubstituted alkyl group having 1 to 5 carbon atoms. The alkyl group having 1 to 5 carbon atoms may be, for example, the alkyl group having 1 to 5 carbon atoms exemplified above. In some embodiments, some or all of the hydrogen atoms of the alkyl group having 1 to 5 carbon atoms may be replaced/substituted with fluorine (F) atoms.

In some embodiments, $L^1$ may be an alkyl group having 1 to 5 carbon atoms or may have a structure of the above general formula (3). Preferably, $L^1$ may be an alkyl group having 1 to 5 carbon atoms. More preferably, $L^1$ may be a methyl group. In such a case, the material for fabricating the thin film according to some embodiments may have excellent thermal stability and may form a high quality thin film with a high yield.

Following compounds No. 1 to No. 256 may be specific examples of the general formula (1) according to some embodiments of the present inventive concept. However, these are merely examples, and the present inventive concept is not limited to these examples. In the following compounds No. 1 to No. 256, Me represents a methyl group, Et represents an ethyl group, nPr represents a n-Propyl group, iPr represents an Isopropyl group, sBu represents a sec-Butyl group, tBu represents a tert-Butyl group, and a tAm represents a tert-Pentyl group.

No. 1

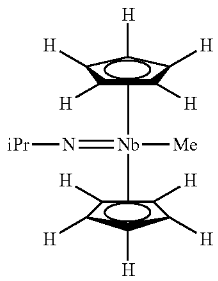

No. 2

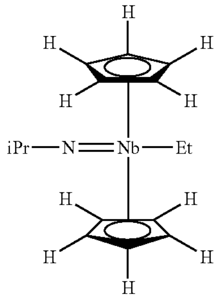

No. 3

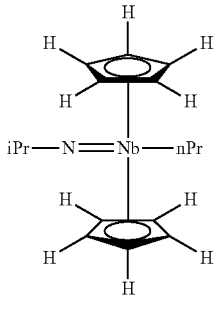

-continued
No. 4
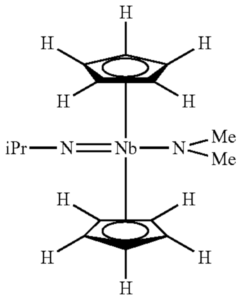
No. 5
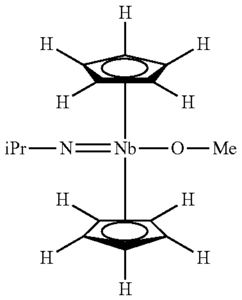
No. 6
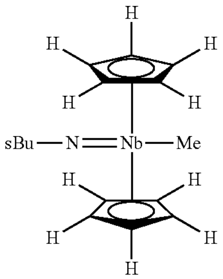
No. 7
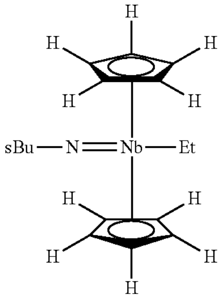
No. 8
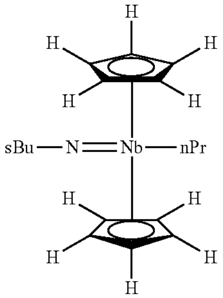
-continued
No. 9
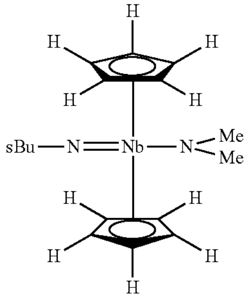
No. 10
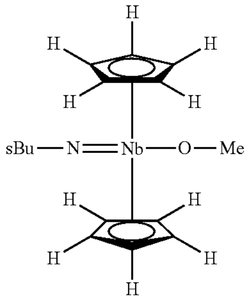
No. 11
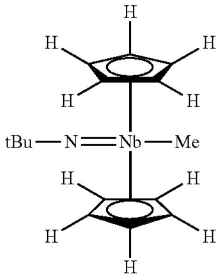
No. 12
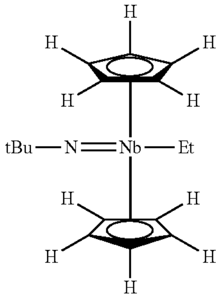
No. 13
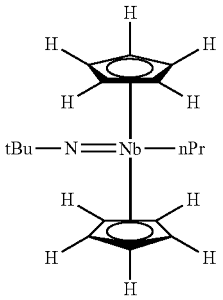

-continued
No. 14
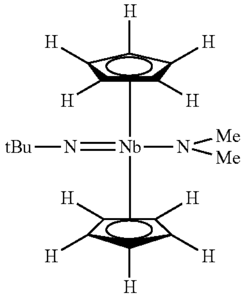
No. 15
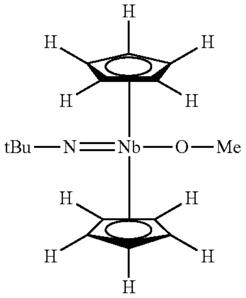
No. 16
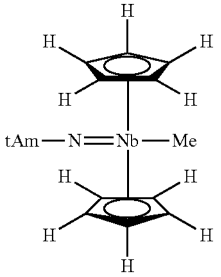
No. 17
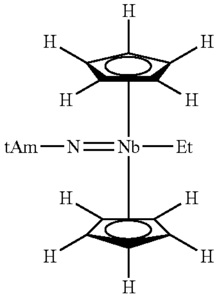
No. 18
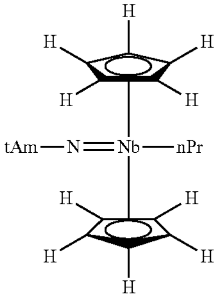
-continued
No. 19
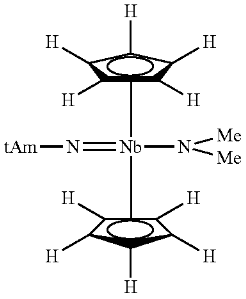
No. 20
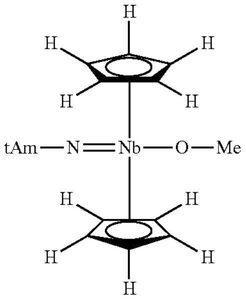
No. 21
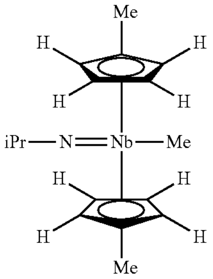
No. 22
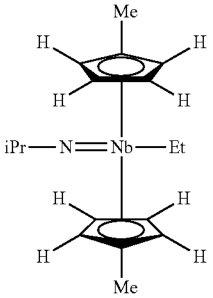
No. 23
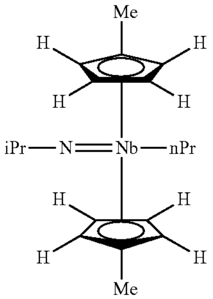

-continued
No. 24
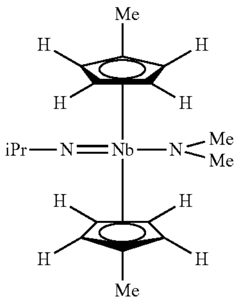
No. 25
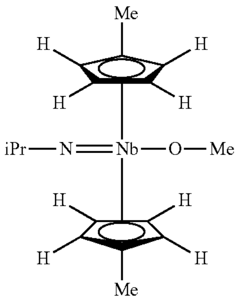
No. 26
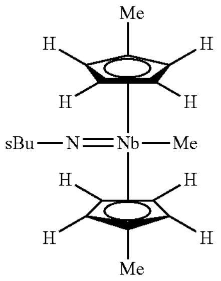
No. 27
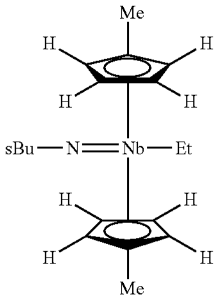
No. 28
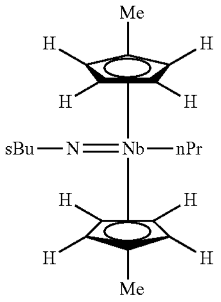
-continued
No. 29
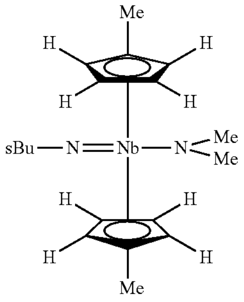
No. 30
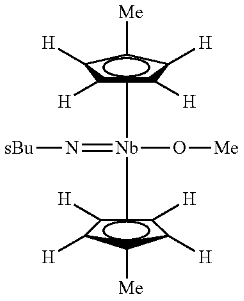
No. 31
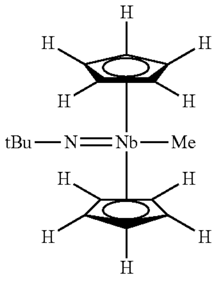
No. 32
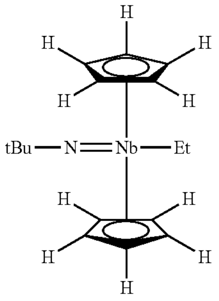
No. 33
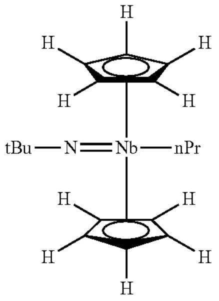

-continued
No. 34
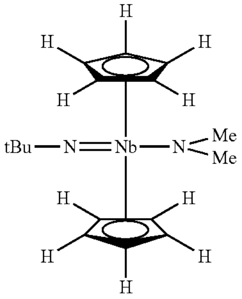
No. 35
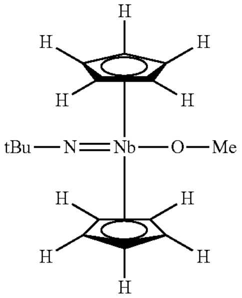
No. 36
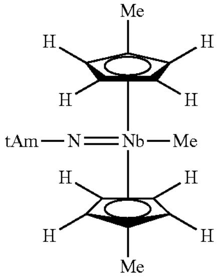
No. 37
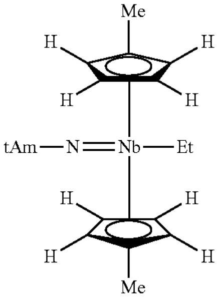
No. 38
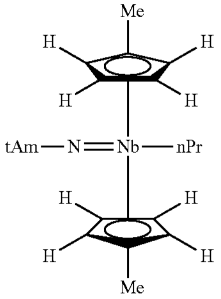
-continued
No. 39
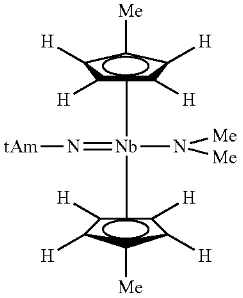
No. 40
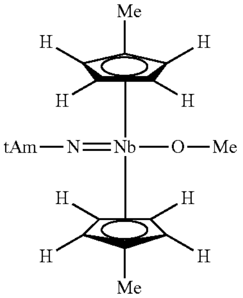
No. 41
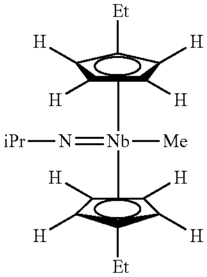
No. 42
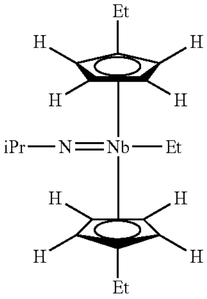
No. 43
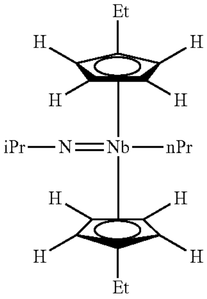

-continued
No. 44
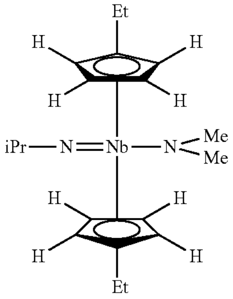
No. 45
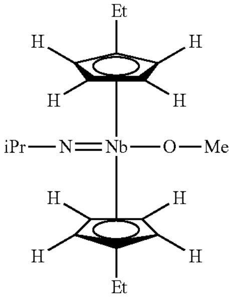
No. 46
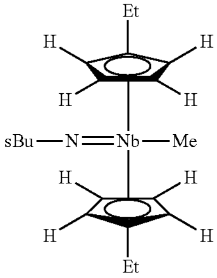
No. 47
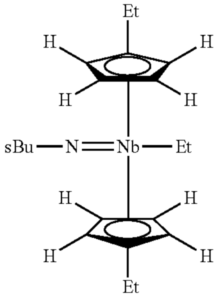
No. 48
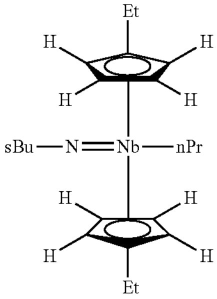
-continued
No. 49
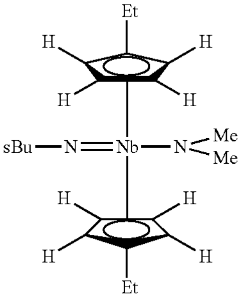
No. 50
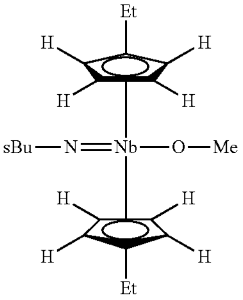
No. 51
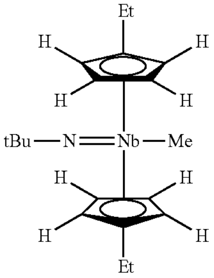
No. 52
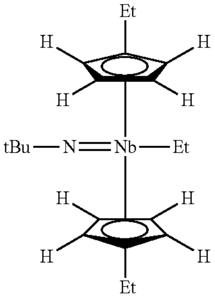
No. 53
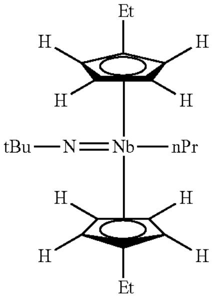

-continued
No. 54
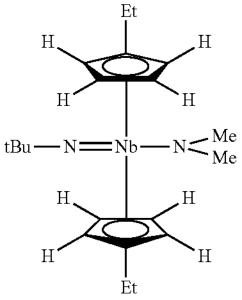
No. 55
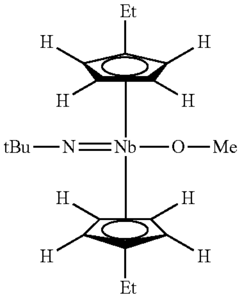
No. 56
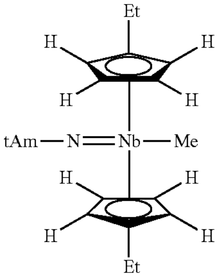
No. 57
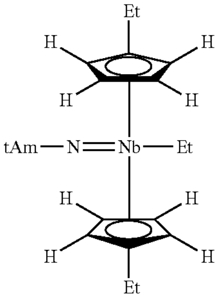
No. 58
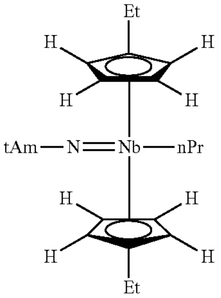
-continued
No. 59
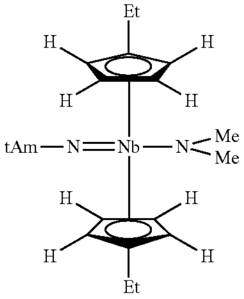
No. 60
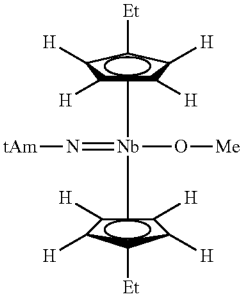
No. 61
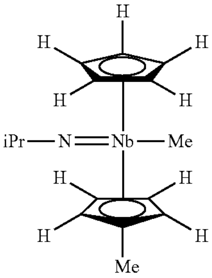
No. 62
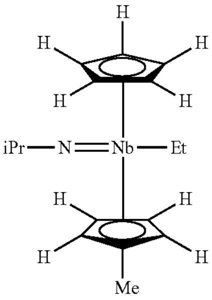
No. 63
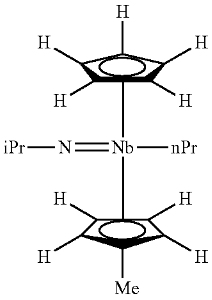

-continued
No. 64
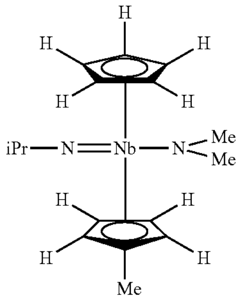
No. 65
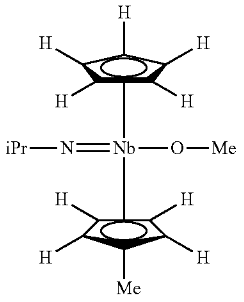
No. 66
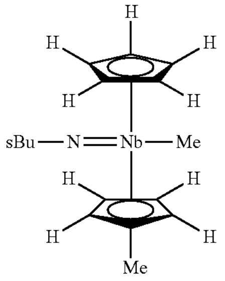
No. 67
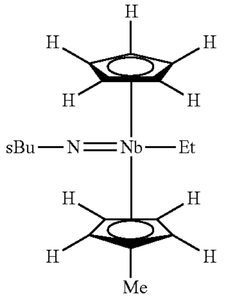
No. 68
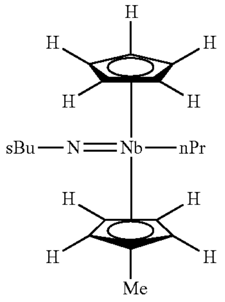
-continued
No. 69
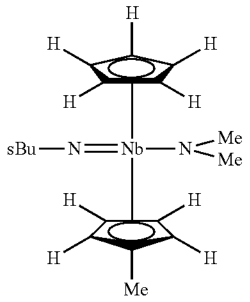
No. 70
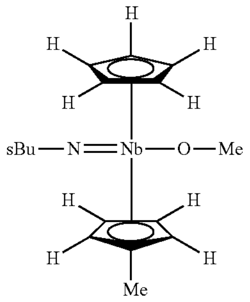
No. 71
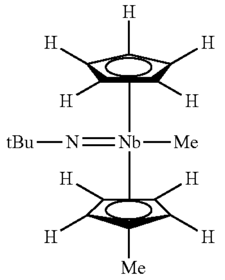
No. 72
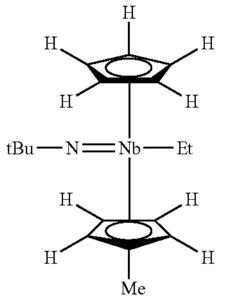
No. 73
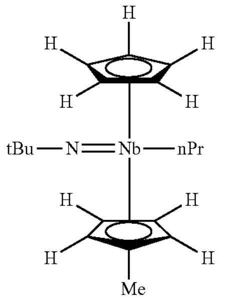

No. 74
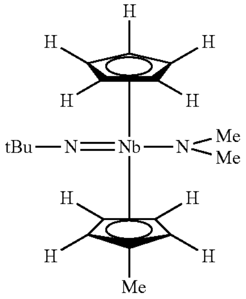
No. 75
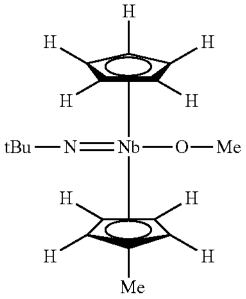
No. 76
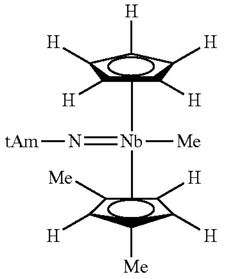
No. 77
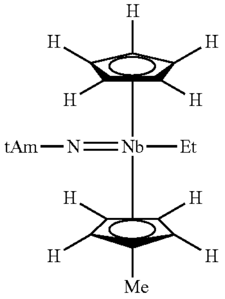
No. 78
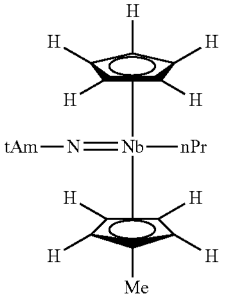
No. 79
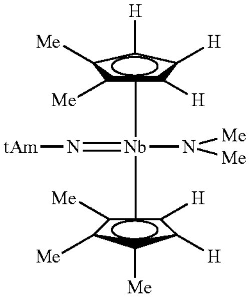
No. 80
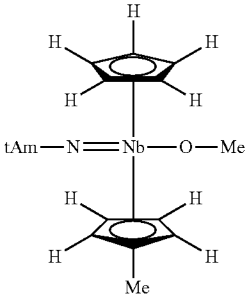
No. 81
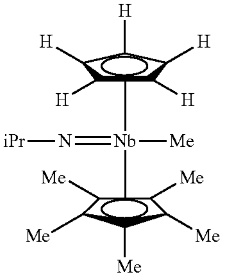
No. 82
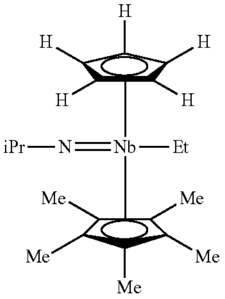
No. 83
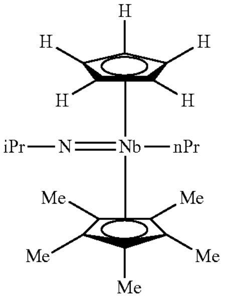

-continued
No. 84
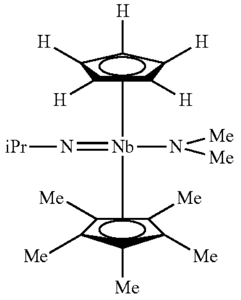
No. 85
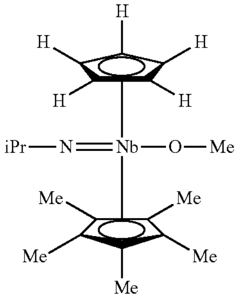
No. 86
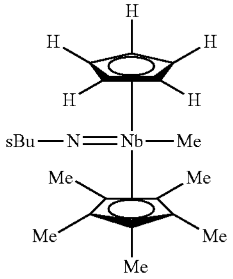
No. 87
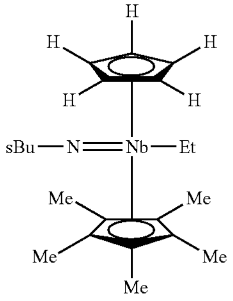
No. 88
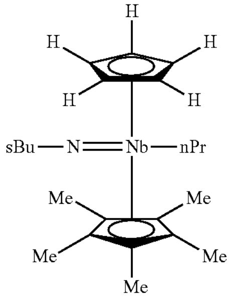
-continued
No. 89
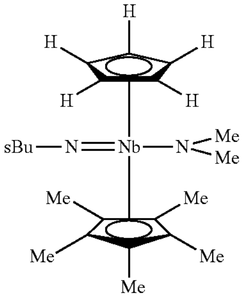
No. 90
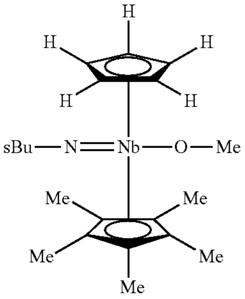
No. 91
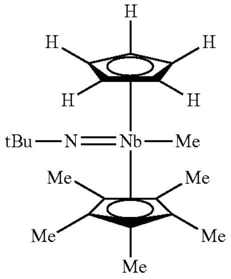
No. 92
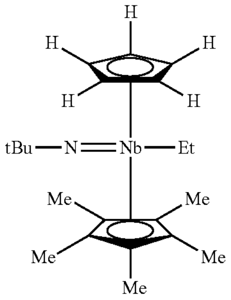
No. 93
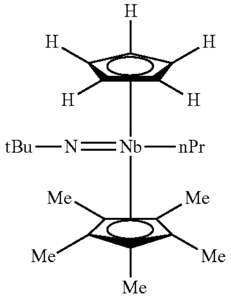

-continued
No. 94
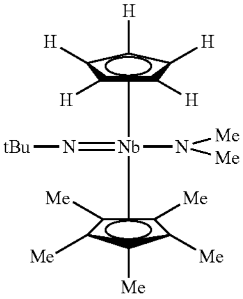
No. 95
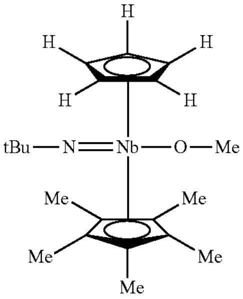
No. 96
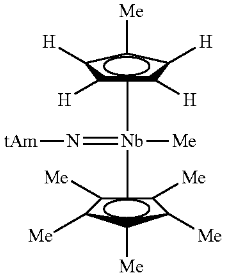
No. 97
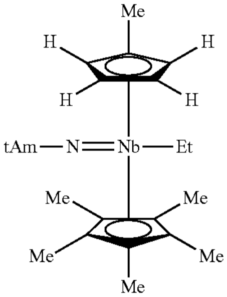
No. 98
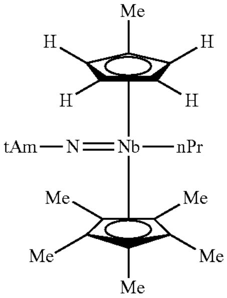
-continued
No. 99
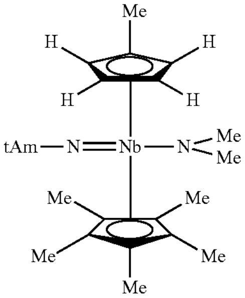
No. 100
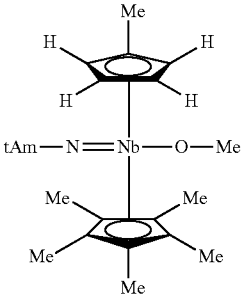
No. 101
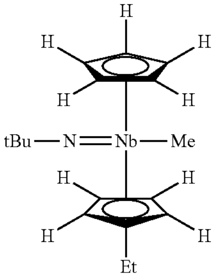
No. 102
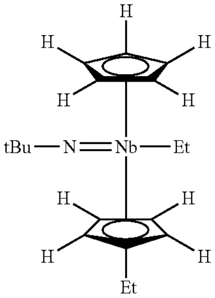
No. 103
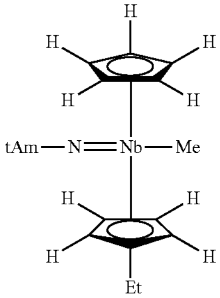

-continued
No. 104
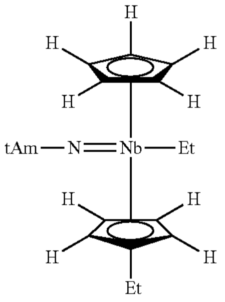
No. 105
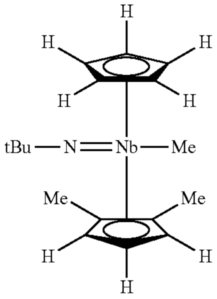
No. 106
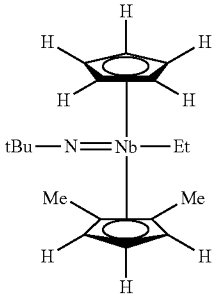
No. 107
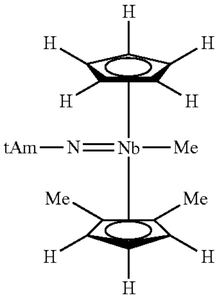
No. 108
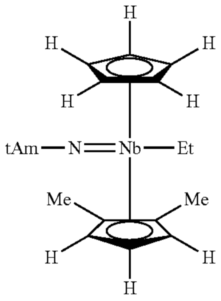
-continued
No. 109
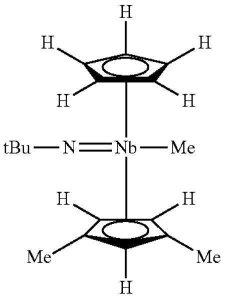
No. 110
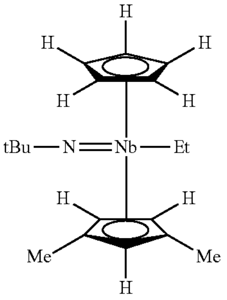
No. 111
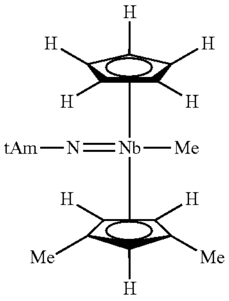
No. 112
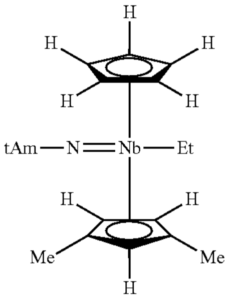
No. 113
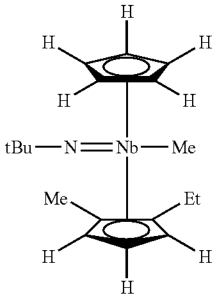

-continued
No. 114
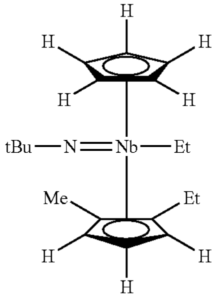
No. 115
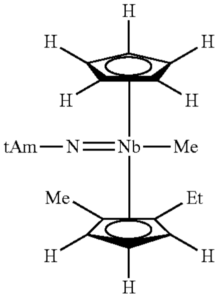
No. 116
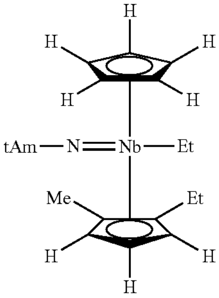
No. 117
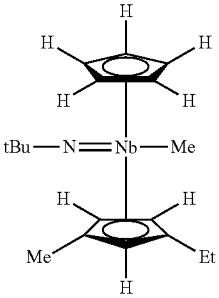
No. 118
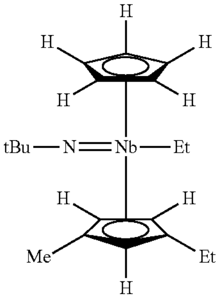
-continued
No. 119
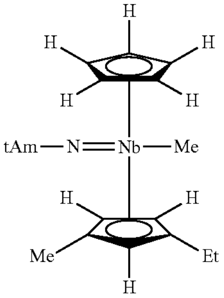
No. 120
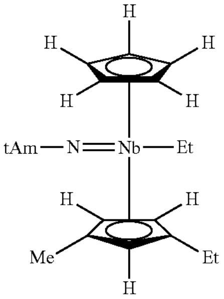
No. 121
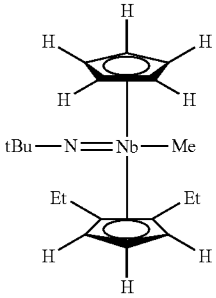
No. 122
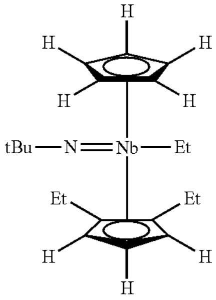
No. 123
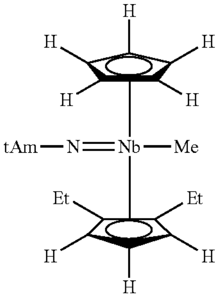

No. 124
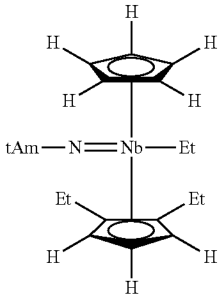
No. 125
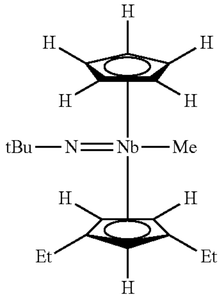
No. 126
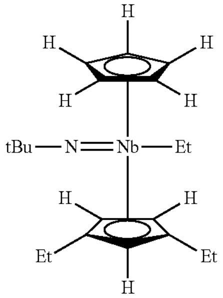
No. 127
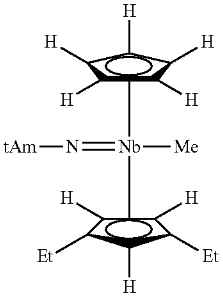
No. 128
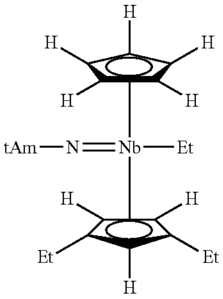
No. 129
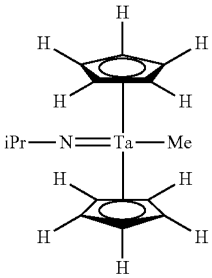
No. 130
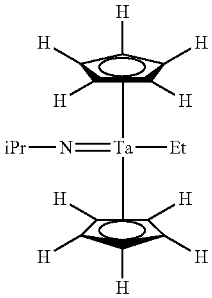
No. 131
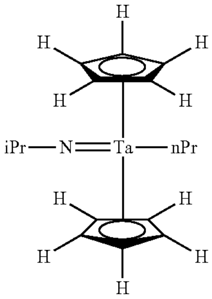
No. 132
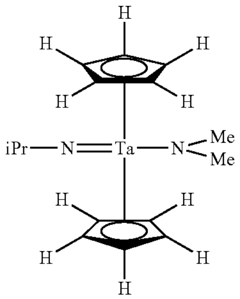
No. 133
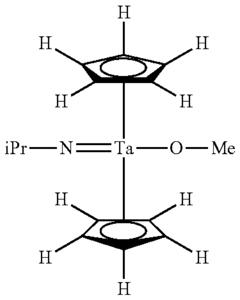

-continued
No. 134
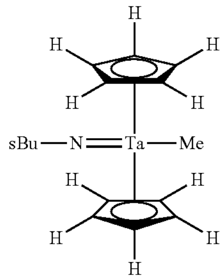
No. 135
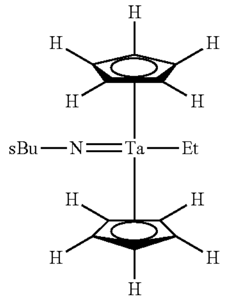
No. 136
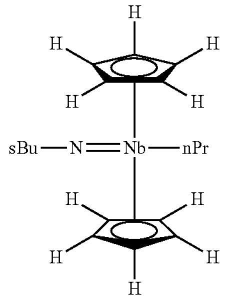
No. 137
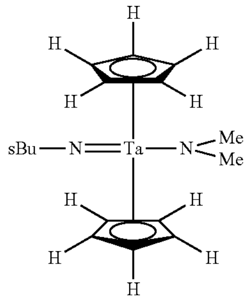
No. 138
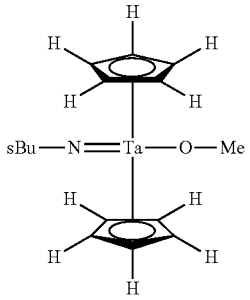
-continued
No. 139
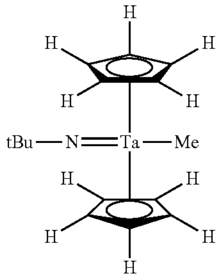
No. 140
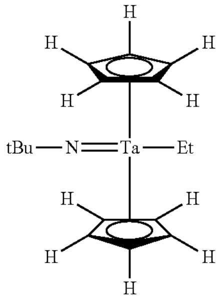
No. 141
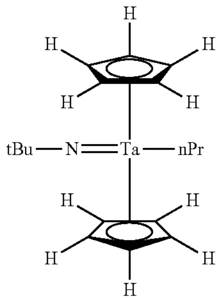
No. 142
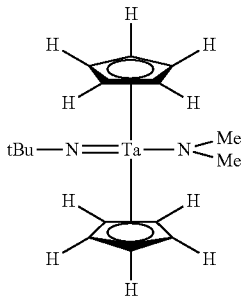
No. 143
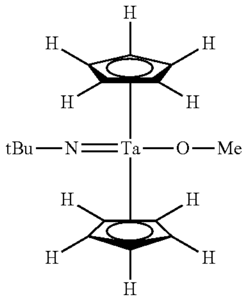

-continued
No. 144
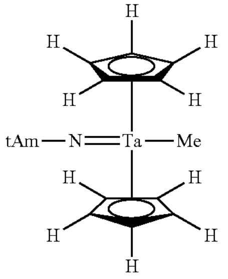
No. 145
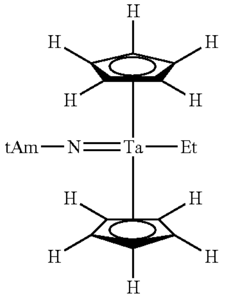
No. 146
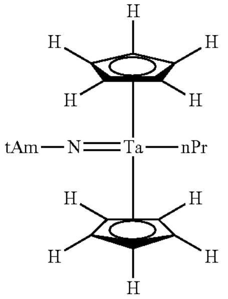
No. 147
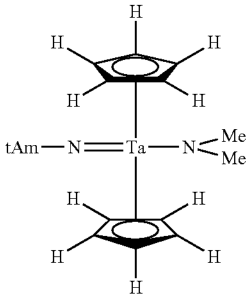
No. 148
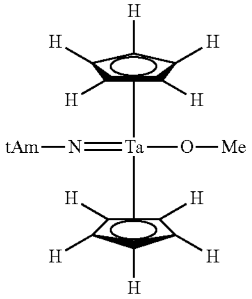
No. 149
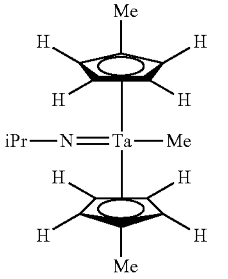
No. 150
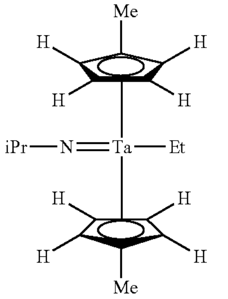
No. 151
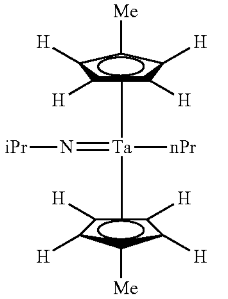
No. 152
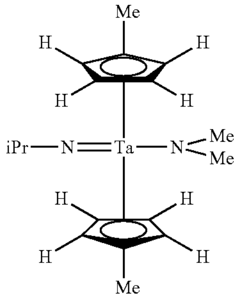
No. 153
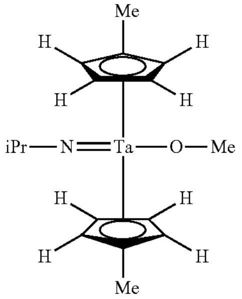

-continued
No. 154
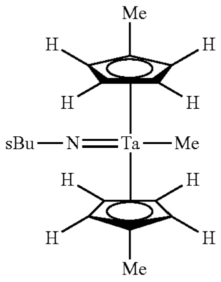
No. 155
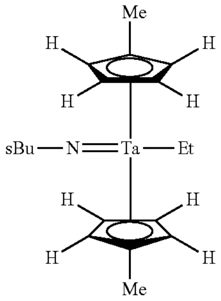
No. 156
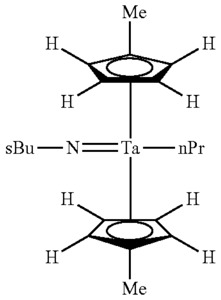
No. 157
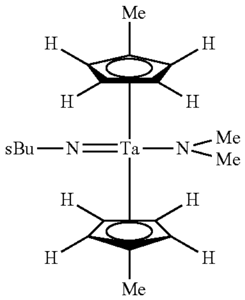
No. 158
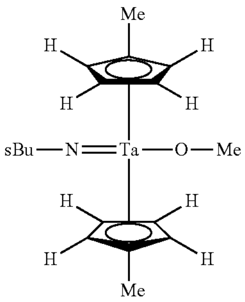
-continued
No. 159
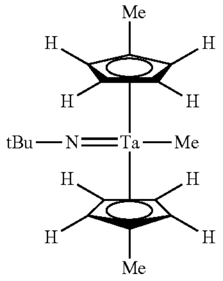
No. 160
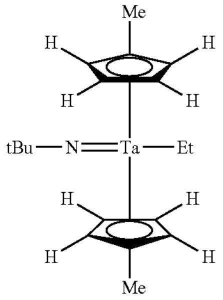
No. 161
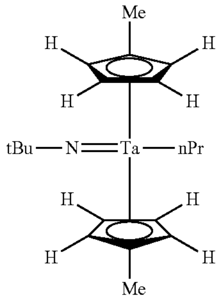
No. 162
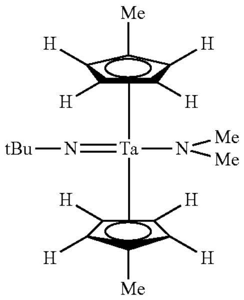
No. 163
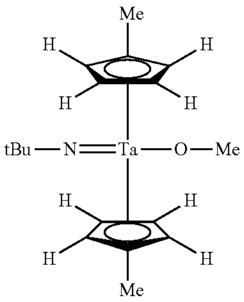

-continued
No. 164
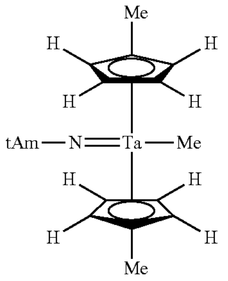
No. 165
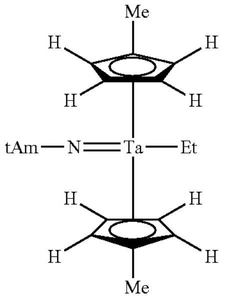
No. 166
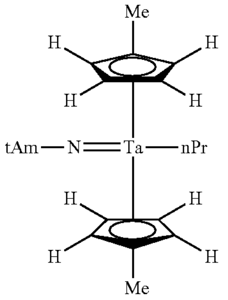
No. 167
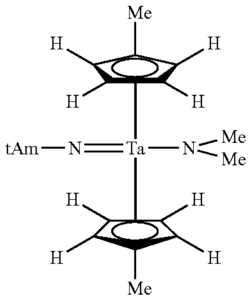
No. 168
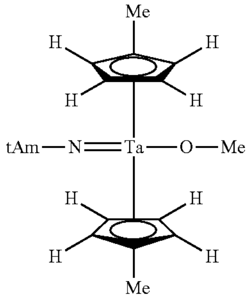
-continued
No. 169
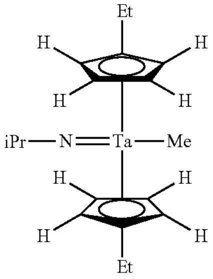
No. 170
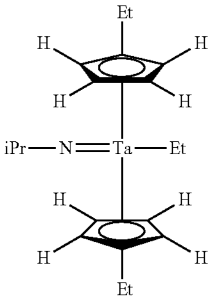
No. 171
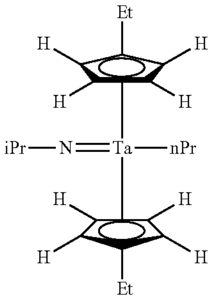
No. 172
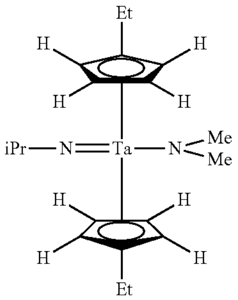
No. 173
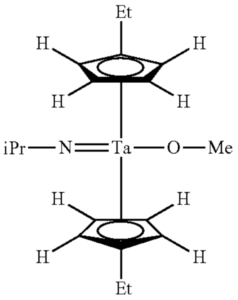

-continued
No. 174
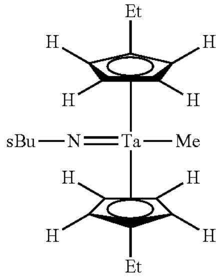
No. 175
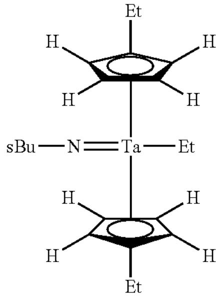
No. 176
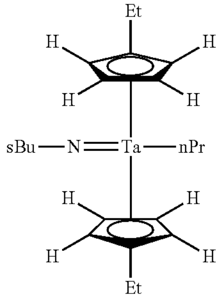
No. 177
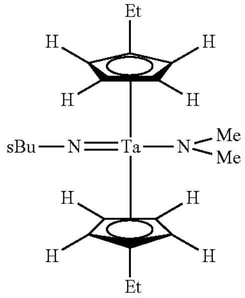
No. 178
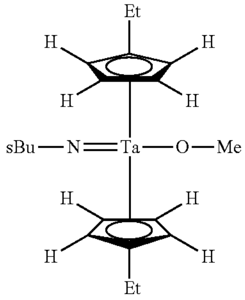
-continued
No. 179
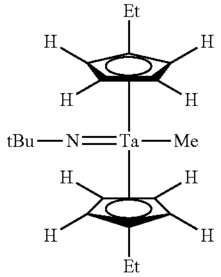
No. 180
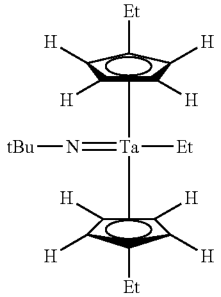
No. 181
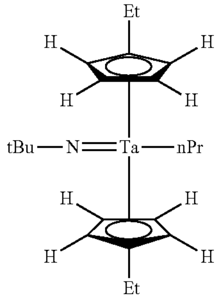
No. 182
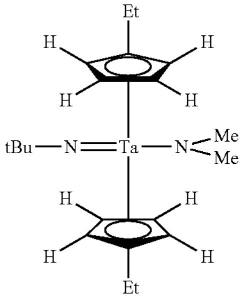
No. 183
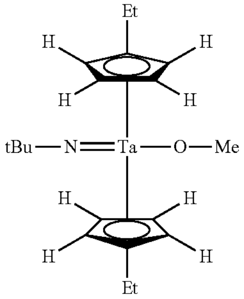

-continued
No. 184
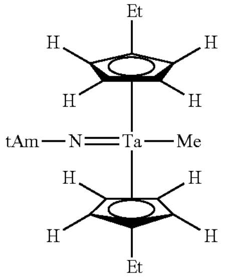
No. 185
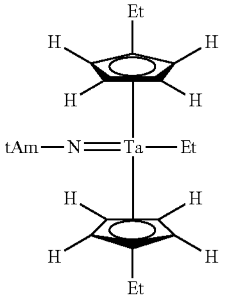
No. 186
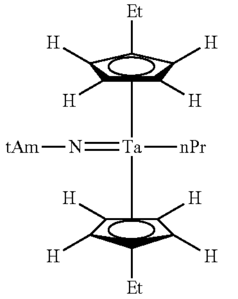
No. 187
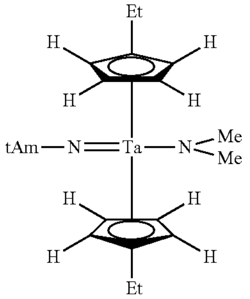
No. 188
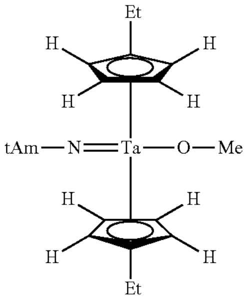
-continued
No. 189
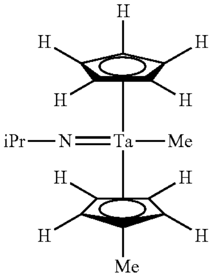
No. 190
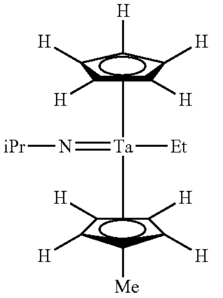
No. 191
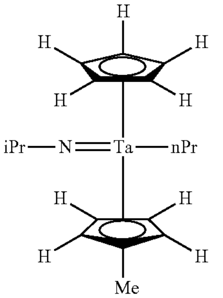
No. 192
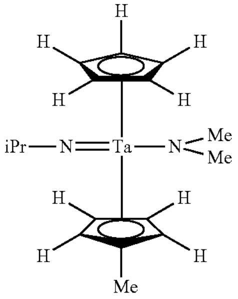
No. 193
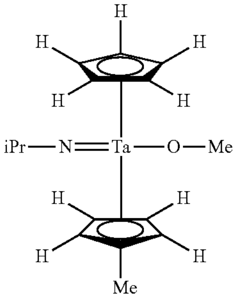

-continued
No. 194
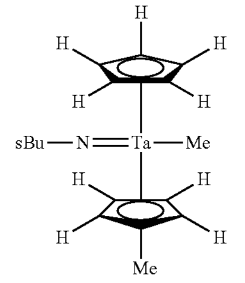
No. 195
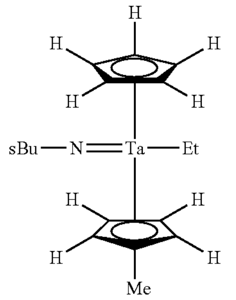
No. 196
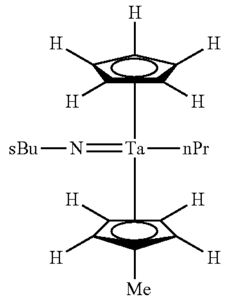
No. 197
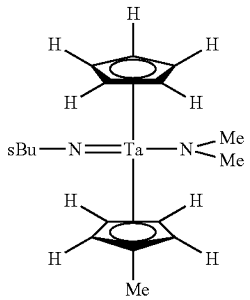
No. 198
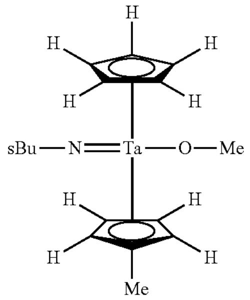
-continued
No. 199
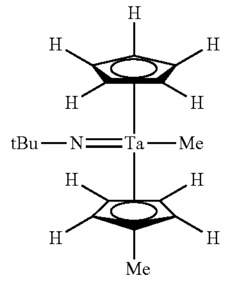
No. 200
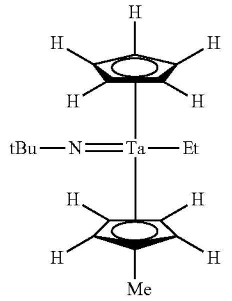
No. 201
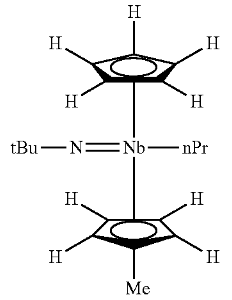
No. 202
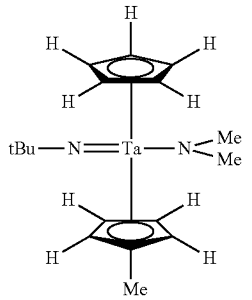
No. 203
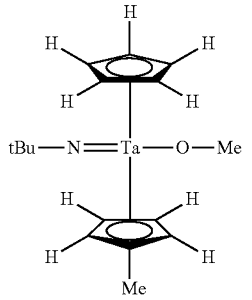

-continued
No. 204
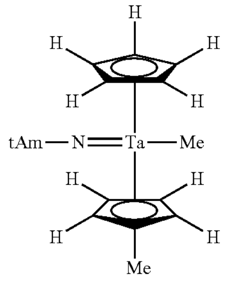
No. 205
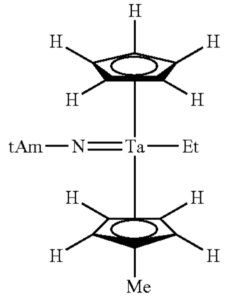
No. 206
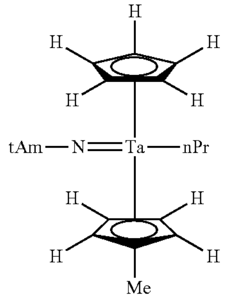
No. 207
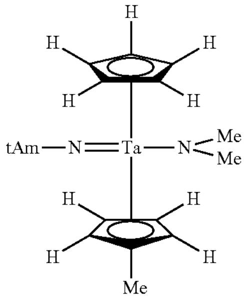
No. 208
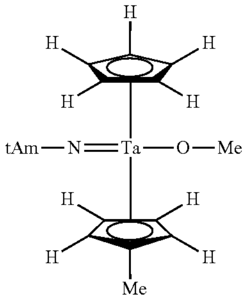
-continued
No. 209
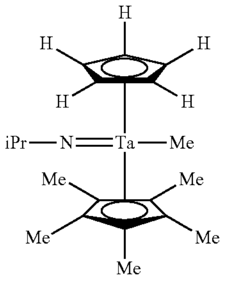
No. 210
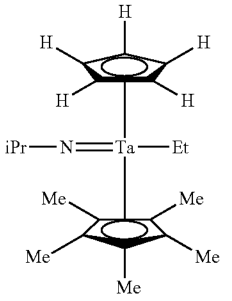
No. 211
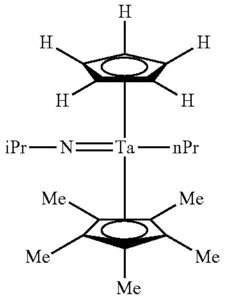
No. 212
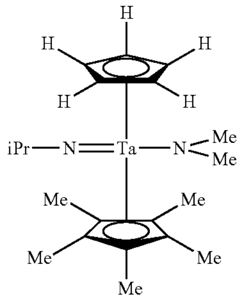
No. 213
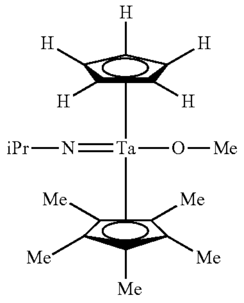

-continued
No. 214
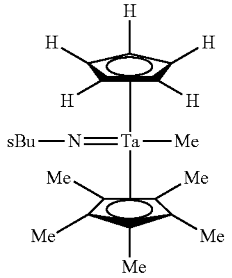
No. 215
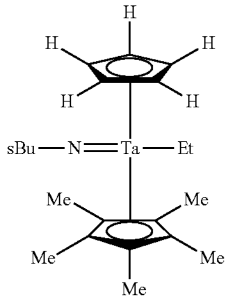
No. 216
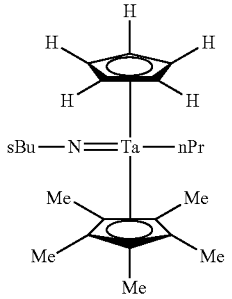
No. 217
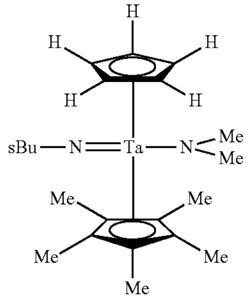
No. 218
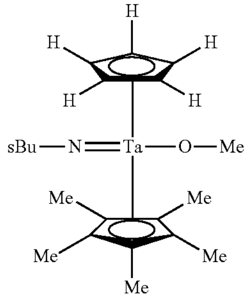
-continued
No. 219
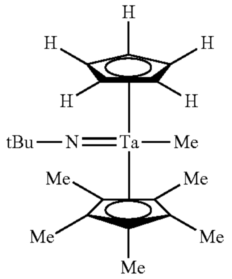
No. 220
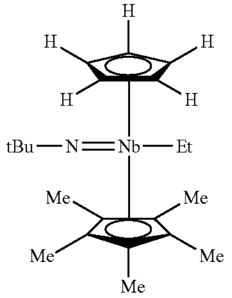
No. 221
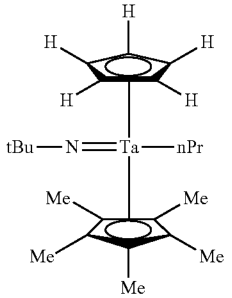
No. 222
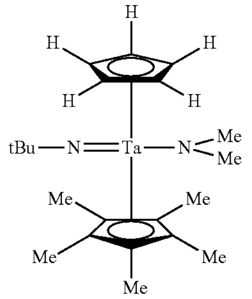
No. 223
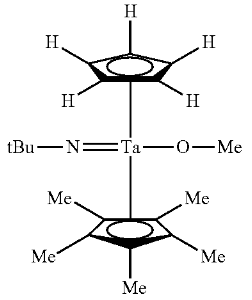

-continued
No. 224
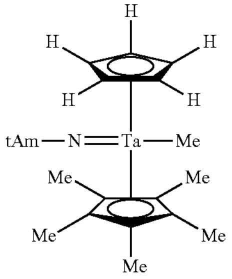
No. 225
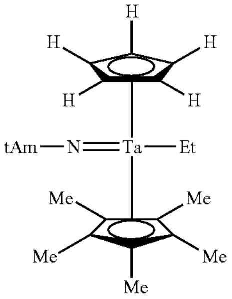
No. 226
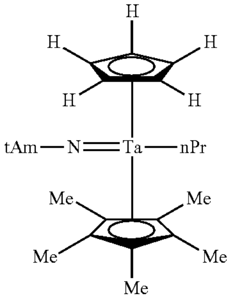
No. 227
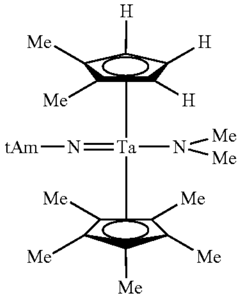
No. 228
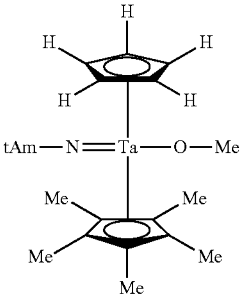
-continued
No. 229
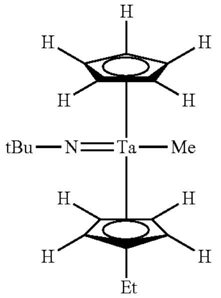
No. 230
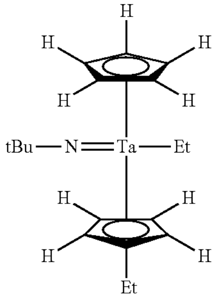
No. 231
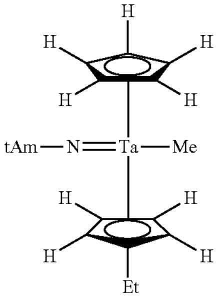
No. 232
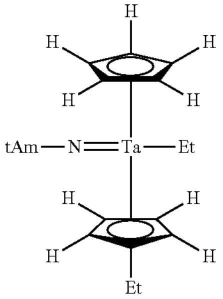
No. 233
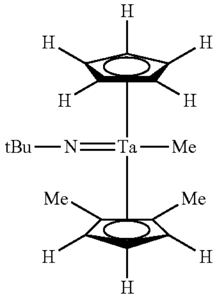

-continued
No. 234
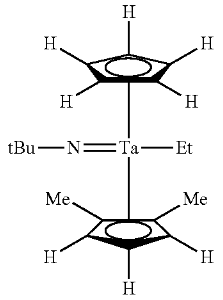
No. 235
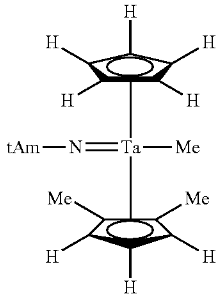
No. 236
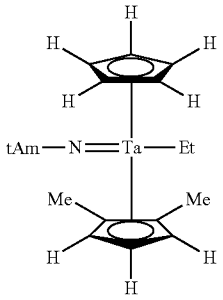
No. 237
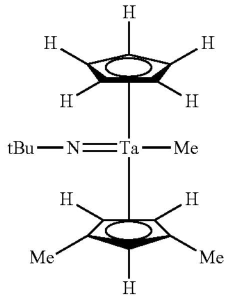
No. 238
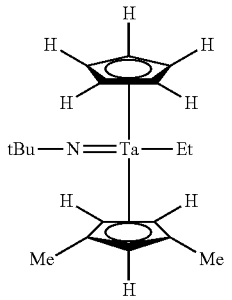
-continued
No. 239
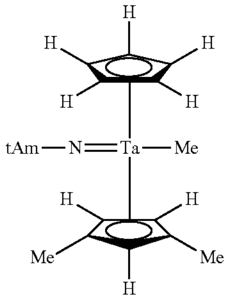
No. 240
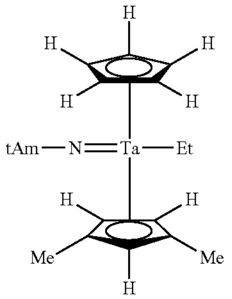
No. 241
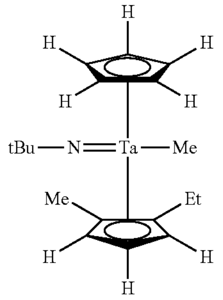
No. 242
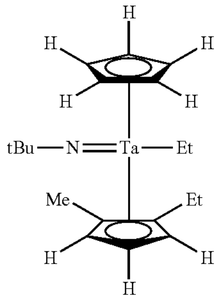
No. 243
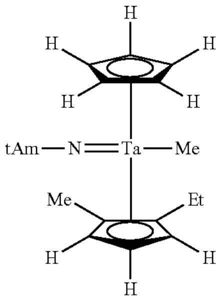

-continued
No. 244
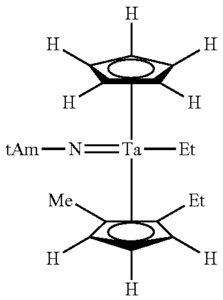
No. 245
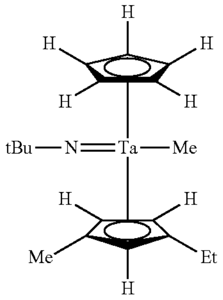
No. 246
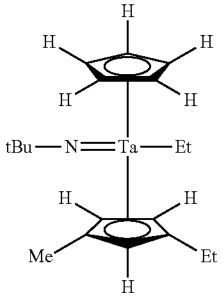
No. 247
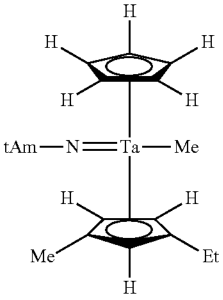
No. 248
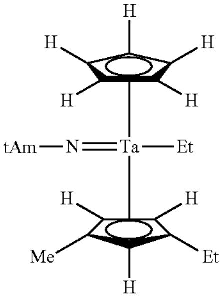
-continued
No. 249
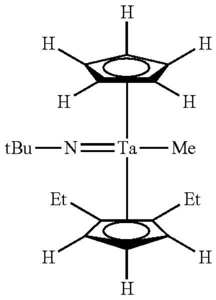
No. 250
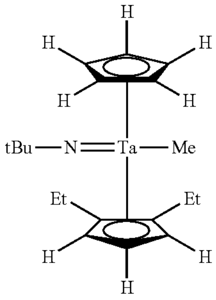
No. 251
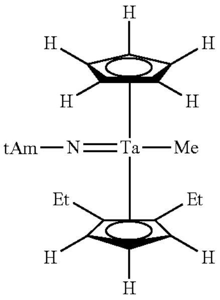
No. 252
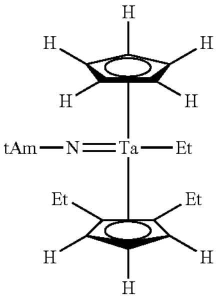
No. 253
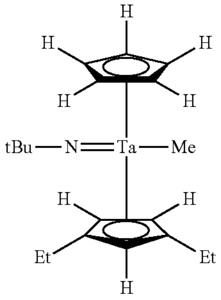

-continued

No. 254

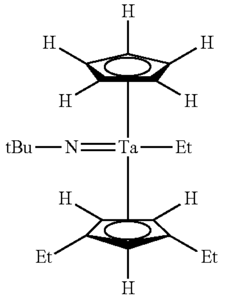

No. 255

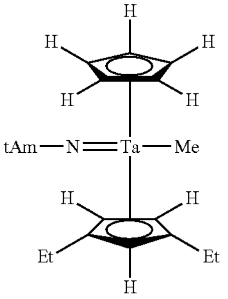

No. 256

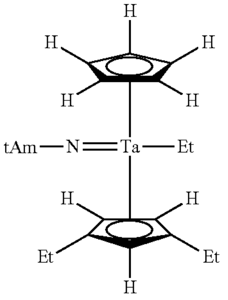

Hereinafter, the present inventive concept will be described more specifically with reference to the following examples, fabricating examples and Comparative examples. The following examples, the fabricating examples and the Comparative examples are only for explaining the present inventive concept, and the present inventive concept is not limited thereto.

[Fabricating Example 1]—Compound No. 16

In an argon (Ar) atmosphere, 100 g (0.370 mol) of Niobium Chloride, 94.9 g (0.777 mol) of Sodium Metasilicate, and 1.2 L of Toluene were mixed in a 3 L flask and cooled, while being stirred. 64.5 g (0.740 mol) of tert-Pentylamine was added, while maintaining the temperature of the solution at 25° C., and the mixture was cooled again, while being stirred at room temperature for 3 hours. While maintaining the solution temperature at 15° C., 97.2 (3.00 mol) of pyridine was added, and the mixture was stirred at room temperature for 4 hours. The prepared solution was depressurized and filtered to remove unreacted materials, and the solvent was removed from the filtered solution to obtain 123 g (yield 75.5%) of intermediate 1 (Nb (=N-tAm) $Cl_3(py)_2$).

In an Ar atmosphere, 4.44 g (0.185 mol) of Sodium Hydride and 75 ml of THE (Tetrahydrofuran) were added to a 200 mL flask and cooled. While maintaining the solution temperature at 25° C., 12.9 g (0.185 mol) of Cyclopentadiene was added and stirred at room temperature for 4 hours to prepare a Sodium Cyclopentadienide/THF solution.

40.9 g (0.0924 mol) of the intermediate 1 (Nb(=N-tAm) $Cl_3(py)_2$) and 200 mL of Toluene were mixed into a 500 mL flask, and stirred at room temperature. The prepared Sodium Cyclopentadienide/THF solution was added thereto, and the mixture was stirred at room temperature for 4 hours. The prepared solution was depressurized to remove the solvent, and 180 mL of Toluene was added. While cooling and maintaining the temperature of the solution at 10° C., 73 mL (0.0841 mol) of Methyllithium/Ether solution was added, and the mixture was stirred at room temperature for 16 hours. The prepared solution was depressurized to remove the solvent, and 200 mL of Toluene was added. Unreacted materials were removed by filtering the prepared solution, and the solvent was removed from the filtered solution, and then distilled and purified to prepare 16.5 g (yield 55.2%) of the compound.

The prepared compound was evaluated as described below, and it was confirmed that the compound No. 16 was prepared.

[Evaluation of Fabricating Example 1]

As a result of normal pressure TG-DTA analysis (a pressure: 760 torr, an Ar flow rate: 100 mL/min, a temperature rising rate: 10° C./min), it was confirmed that the mass 50% reduction temperature was 236° C.

As a result of 1H-NMR analysis (solvent: heavy benzene (Benzene-d6)), 5.53 ppm 10H, singlet), 1.23 ppm (2H, quartet), 0.94 ppm (3H, singlet), 0.92 ppm (6H, singlet), 0.85 ppm (3H, triplet) was confirmed.

As a result of mass spectrometry, Nb: 29.0% (28.7%), C: 58.1% (59.5%), H: 6.9% (7.5%), and N: 5.1% (4.3%) were confirmed. Here, the numeral values in parentheses are theoretical values of compound No. 16.

[Fabricating Example 2]—Compound No. 31

In Example 1, the addition of 64.5 g (0.740 mol) of tert-Pentylamine to the 3 L flask was changed to addition of 54.1 g (0.777 mol) of tert-Butylamine to prepare 135 g (yield 85.1%) of the intermediate 2 (Nb(=N-tBu)$Cl_3(py)_2$).

In Example 1, the addition of 12.9 g (0.185 mol) of Cyclopentadiene to a 200 mL flask was changed to the addition of 14.8 g (0.185 mol) of Methylcyclopentadiene to prepare a Sodium Methylcyclopentadienide/THF solution.

In Example 1, in a 500 mL flask, 40.9 g (0.0924 mol) of the intermediate 1 (Nb(=N-tAm)$Cl_3(py)_2$) was changed to 36.9 g (0.0924 mol) of intermediate 2 (Nb(=N-tBu)$Cl_3$ $(py_2)$), and the Sodium Cyclopentadienide/THF solution was changed to the Sodium Methylcyclopentadienide/THF solution to prepare 18.2 g (yield 58.4%) of the compound.

The prepared compound was evaluated as described below, and it was confirmed that the compound No. 31 was prepared.

[Evaluation of Fabricating Example 2]

As a result of normal pressure TG-DTA analysis (a pressure: 760 torr, an Ar flow rate: 100 mL/min, and a temperature rising rate: 10° C./min), it was confirmed that the mass 50% reduction temperature was 230° C.

As a result of 1H-NMR analysis (solvent: heavy benzene (Benzene-d6)), 5.74 ppm (2H, multiplet), 5.50 ppm (2H, multiplet), 5.29 ppm (2H, multiplet), 5.04 ppm (2H, multiplet), 1.92 ppm (6H, singlet), 1.01 ppm (9H, singlet), 0.82 ppm (3H, singlet) were confirmed.

As a result of mass spectrometry, Nb: 28.2% (27.5%), C: 58.5% (60.5%), H: 8.9% (7.8%), N: 5.0% (4.2%) were confirmed. Here, the numerical values in parentheses are theoretical values of compound No. 31.

[Fabricating Example 3]—Compound No. 51

In Example 2, the addition of 14.8 g (0.185 mol) of Methylcyclopentadiene to a 200 mL flask was changed to the addition of 17.4 g (0.185 mol) of Ethylcyclopentadiene to prepare a Sodium Ethylcyclopentadienide/THF solution.

In Example 2, the Sodium Methylcyclopentadienide/THF solution was changed to the Sodium Ethylcyclopentadienide/THF solution in a 500 mL flask to prepare 14.3 g (yield 42.4%) of the compound.

The prepared compound was evaluated as described below, and it was confirmed that the compound No. 51 was prepared.

[Evaluation of Fabricating Example 3]

As a result of normal pressure TG-DTA analysis (a pressure: 760 torr, an Ar flow rate: 100 mL/min, and a temperature rising rate: 10° C./min), it was confirmed that the mass 50% reduction temperature was 244° C.

As a result of 1H-NMR analysis (solvent: heavy benzene (Benzene-d6)), 5.53 ppm (2H, multiplet), 5.39 ppm (2H, multiplet), 5.13 ppm (2H, multiplet), 4.92 ppm (2H, multiplet), 2.17 ppm (4H, multiplet), 0.92 ppm (6H, triplet), 0.84 ppm (9H, singlet), and 0.63 ppm (3H, singlet) were confirmed.

As a result of mass spectrometry, Nb: 27.0% (25.4%), C: 63.5% (62.5%), H: 9.9% (8.3%), and N: 4.0 (3.8%) were confirmed. Here, the numerical values in parentheses are theoretical values of compound No. 51.

[Fabricating Example 4]—Compound No. 101

In an Ar atmosphere, 21.0 g (0.0777 mol) of Niobium Chloride and 600 mL of Dichloromethane were mixed in a 2 L flask, 11.3 g (0.777 mol) of Trimethylsilyl cyclopentadiene was added while being stirred at room temperature, an the mixture was stirred at room temperature for 1 hour. The solvent was removed by decompressing and drying the prepared solution. 80 mL of Dichloromethane was added thereto, 17.0 g (0.233 mol) of tert-Butylamine was added, while being stirred at room temperature, and the mixture was subjected to reflux stirring for 12 hours. An unreacted material and the solvent were removed from the prepared solution, and the mixture was extracted with Toluene (120 mL) and then filtered.

While cooling and stirring the filtered solution, 50 mL (0.0500 mol) of 1M Methyllithium/diethylEther solution was added, and the mixture was stirred at room temperature for 6 hours. The unreacted material and the solvent were removed from the prepared solution, extracted with Toluene 100 mL, and then filtered. After removing the solvent from the filtered solution, it was distilled and purified to prepare 5.21 g (yield 19.9%) of the compound.

The prepared compound was evaluated as described below to confirm that the compound No. 101 was prepared.

[Evaluation of Fabricating Example 4]

As a result of normal pressure TG-DTA analysis (a pressure: 760 torr, an Ar flow rate: 100 mL/min, and a temperature rising rate: 10° C./min), it was confirmed that the mass 50% reduction temperature was 225° C.

As a result of 1H-NMR analysis (solvent: heavy benzene (Benzene-d6)), 5.65 ppm (1H, multiplet), 5.58 ppm (4H, singlet), 5.52 ppm (1H, multiplet), 5.29 ppm (1H, multiplet), 5.10 ppm (1H, multiplet), 2.32 ppm (2H, multiplet), 1.07 ppm (3H, triplet), 1.00 ppm (9H, singlet), and 0.88 ppm (3H, singlet) were confirmed.

As a result of mass spectrometry, Nb: 27.0% (27.5%), C: 61.9% (60.5%), H: 9.0% (7.8%), and N: 4.9 (4.2%) were confirmed. Here, the numerical values in parentheses are theoretical values of compound No. 101.

[Evaluation of Thermal Stability]

A thermal decomposition initiation temperature of compound No. 11, compound No. 16 (Fabricating example 1), compound No. 31 (Fabricating example 2), compound No. 51 (Fabricating example 3), Comparative example 1 represented by the following chemical formula 1, and Comparative example 2 represented by the following chemical formula 2 was measured and shown in Table 1 below. The thermal decomposition initiation temperature was measured using a differential scanning calorimetry (DSC) measuring device.

[Chemical formula 1]

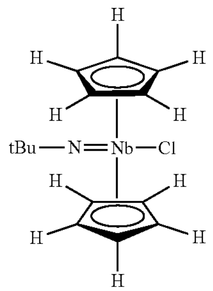

In Chemical Formula 1, tBu represents a tert-Butyl group.

[Chemical formula 2]

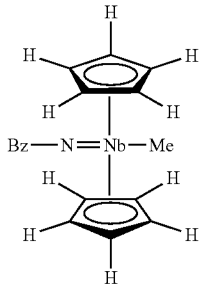

In Chemical Formula 2, Me represents a Methyl group, and Bz represents a Benzyl group.

TABLE 1

| Compound | Thermal decomposition initiation temperature (° C.) |
|---|---|
| No. 11 | 340 |
| No. 16 | 335 |
| No. 31 | 305 |
| No. 51 | 300 |
| Comparative example 1 | 230 |
| Comparative example 2 | 100 or less |

As shown in Table 1 above, the thermal decomposition initiation temperatures of compound No. 11, compound No. 16 (Fabricating example 1), compound No. 31 (Fabricating example 2) and compound No. 51 (Fabricating example 3) are all 300° C. or higher, and it is possible to know that the thermal decomposition initiation temperature thereof are significantly higher than those of Comparative example 1 and Comparative example 2.

Since a compound having a high thermal decomposition initiation temperature is hard to undergo the thermal decomposition, compound No. 11, compound No. 16 (Fabricating example 1), compound No. 31 (Fabricating example 2) and compound No. 51 (Fabricating example 3) have excellent thermal stability, and can be determined to be suitable as a material for fabricating the thin film. In particular, compound No. 11 and compound No. 16 have a thermal decomposition initiation temperature of 350° C. or higher, and thus may be further excellent in thermal stability.

[Evaluation of Melting Point]

The melting point of compound No. 11, compound No. 16 (Fabricating example 1), compound No. 31 (Fabricating example 2), compound No. 51 (Fabricating example 3), Comparative example 1, and Comparative example 2 was measured and shown in Table 2 below. First, the phase was observed with the naked eye at 25° C., and the melting point of the compound that is solid at 25° C. was measured.

TABLE 2

| Compound | Phase at 25° C. | Melting point (° C.) |
|---|---|---|
| No. 11 | Solid | 27 |
| No. 16 | Liquid | — |
| No. 31 | Liquid | — |
| No. 51 | Liquid | — |
| Comparative example 1 | Solid | 72 |
| Comparative example 2 | — | — |

As shown in Table 2 above, it is possible to know that compound No. 16 (Fabricating example 1), compound No. 31 (Fabricating example 2) and compound No. 51 (Fabricating example 3) are liquid at 25° C. Compound No. 11 is solid at 25° C., but has a melting point of 27° C., and it is possible to know that compound No. 11 has a melting point significantly lower than that of Comparative example 1. In the case of Comparative example 2, the melting point could not be measured due to decomposition.

Since the compound having a low melting point is provided as a liquid and may be easily transported, compound No. 11, compound No. 16 (Fabricating example 1), compound No. 31 (Fabricating example 2) and compound No. 51 (Fabricating example 3) can be determined to be suitable as a material for fabricating the thin film.

The material for fabricating a thin film according to some embodiments may be used for fabricating a metal film including only (e.g., consisting essentially of) Group 5 element. In such a case, the material for fabricating the thin film according to some embodiments does not include any other metal compound or non-metal compound, except for the Group 5 element precursor represented by the general formula (1).

The material for fabricating the thin film according to some embodiments may be used for fabricating a metal/non-metal thin film or a non-metal thin film further including an element other than the Group 5 element. In such a case, the material for fabricating the thin film according to some embodiments may further include other metal compounds or non-metal compounds (hereinafter, referred to as "other precursor") other than the Group 5 element precursor represented by the general formula (1).

The other precursor may include, for example, an organic compound of one, two, or more kinds selected from compounds used as an organic ligand, such as alcohol compounds, Glycol compounds, β-Diketone compounds, or Cyclopentadiene compounds, and combinations thereof; organic Amine compounds and combinations thereof; compounds of silicon (Si); or metal compounds; and combinations thereof.

The metals of the above-mentioned other precursor may include, for example, Lithium, Natrium, Kalium, Magnesium, Calcium, Strontium, Barium, Titanium, Zirconium, Hafnium, Vanadium, Niobium, Tantalum, Chrome, Tungsten, Manganese, Iron, Osmium, Ruthenium, Cobalt, Rhodium, Iridium, Nickel, Palladium, Platinum, Copper, Argentum, Aurum, Zinc, Aluminum, Gallium, Indium, Germanium, Tin, Lead, Antimony, Bismuth, Radium, Scandium, Ruthenium, Yttrium, Lanthanum, Cerium, Praseodymium, Neodymium, Promethium, Samarium, Europium, Gadolinium, Terbium, Dysprosium, Holmium, Erbium, Thulium, Ytterbium, and/or Lutetium. As used herein the term "and/or" includes any and all combinations of one or more of the associated listed items.

Alcohol compounds used as the organic ligand may include, for example, at least one of Alkyl alcohols such as Methanol, Ethanol, Propanol, Isopropyl alcohol, Butanol, sec-Butyl alcohol, Isobutyl alcohol, tert-Butyl alcohol, Pentyl alcohol, Isopentyl alcohol, and tert-Pentyl alcohol; Ether alcohols such as 2-Methoxyethanol, 2-Ethoxyethanol, 2-Butoxyethanol, 2-(2-Methoxyethoxy)ethanol, 2-Methoxy-1-Methylethanol, 2-Methoxy-1, 1-Dimethylethanol, 2-Ethoxy-1, 1-Dimethylethanol, 2-Isopropoxy-1, 1-Dimethylethanol, 2-Butoxy-1, 1-Dimethylethanol, 2-(2-Methoxyethoxy)-1, 1-Dimethylethanol, 2-oropoxy-1, 1-Diethylethanol, 2-sec-Butoxy-1, 1-Diethylethanol, 3-Methoxy-1, and 1-Dimethylpropanol; Dialkylaminoalcohols such as Dimethylaminoethanol, Ethylmethylaminoethanol, Diethylaminoethanol, Dimethylamino-2-pentanol, Ethylmethylamino-2-pentanol, Dimethylamino-2-methyl-2-pentanol, Ethylmethylamino-2-methyl-2-pentanol, and Diethylamino-2-methyl-2-pentanol, and combinations thereof.

Glycol compounds used as the organic ligand may include, for example, at least one of 1,2-Ethanediol, 1,2-Propanediol, 1,3-Propanediol, 2,4-Hexanediol, 2,2-Dimethyl-1,3-propanediol, 2,2-Diethyl-1,3-propanediol, 1,3-Butanediol, 2,4-Butanediol, 2,2-Diethyl-1,3-butanediol, 2-Ethyl-2-butyl-1,3-Propanediol, 2,4-Pentanediol, 2-Methyl-1,3-propanediol, 2-Methyl-2,4-pentanediol, 2,4-Hexanediol, 2,4-Dimethyl-2,4-pentanediol and combinations thereof.

β-Diketone compounds used as the organic ligand may include, for example, at least one of Alkyl-substituted β-Diketones such as Acetylacetone, Hexane-2,4-dione, 5-Methylhexane-2,4-dione, Heptane-2,4-dione, 2-Methylheptane-3,5-dione, 5-Methylheptane-2,4-dione, 6-Methylheptane-2,4-dione, 2,2-Dimethylheptane-3,5-dione, 2,6-Dimethylheptane-3,5-dione, 2,2,6-Trimethylheptane-3,5-dione, 2,2,6,6-Tetramethylheptane-3,5-dione, Octane-2,4-dione, 2,2,6-Trimethyloctane-3,5-dione, 2,6-Dimethyloctane-3,5-dione, 2,9-Dimethylnonane-4,6-dione-2-methyl-6-ethyldecane-3,5-dione, and 2,2-Dimethyl-6-ethyldecane-3,5-dione; Fluorine-substituted Alkyl β-Diketones such as 1,1,1-Trifluoropentane-2,4-dione, 1,1,1-Trifluoro-5,5-di ethylhexane-2,4-dione, 1,1,1,5,5,5-Hexafluoropentane-2,4-dione, and 1,3-Diperfluorohexylpropane-1,3-dione; Ether-substituted β-Diketones such as 1,1,5,5-Tetramethyl-1-methoxyhexane-2,4-dione, 2,2,6,6-Tetramethyl-1-methoxyheptane-3,5-dione, and 2,2,6,6-Tetramethyl-1-(2-methoxyethoxy)heptane-3,5-dione, and combinations thereof.

Cyclopentadiene compounds used as the organic ligand may include, for example, at least one of Cyclopentadiene, Methylcyclopentadiene, Ethylcyclopentadiene, Propylcyclopentadiene, Isopropylcyclopentadiene, Butylcyclopentadiene, sec-Butylcyclopentadiene, Isobutylcyclopentadiene, tert-Butylcyclopentadiene, Dimethylcyclopentadiene, Tetramethylcyclopentadiene and combinations thereof.

Organic Amine compounds used as the organic ligand may include, for example, at least one of Methylamine, Ethylamine, Propylamine, Isopropylamine, Butylamine, sec-Butylamine, tert-Butylamine, Isobutylamine, Dimethylamine, Diethylamine, Dipropylamine, Diisopropylamine, Ethylmethylamine, Propylmethylamine, Isopropylmethylamine and combinations thereof.

The aforementioned other precursor may be fabricated, for e ample, by reacting the above-mentioned inorganic salt of a metal or a hydrate thereof with an organic ligand (for example, a salt of the Alcohol compound (e.g., Alkali metal alkoxide)). The inorganic salt of the metal or a hydrate thereof may include, for example, Metal halogen or Metal nitrate. The Alkali metal oxide may include, for example, at least one of Sodium alkoxide, Lithium alkoxide, Kalium alkoxide and combinations thereof.

In some embodiments, a compound having oxidation and decomposition behavior similar to the Group 5 element precursor represented by the general formula (1) may be suitable for the other precursor. When the cocktail source method is applied, compounds, which have oxidation and decomposition behaviors similar to the Group 5 element precursor represented by the general formula (1) and do not deteriorate by a chemical reaction when mixing, may be suitable for the other precursor.

The material for fabricating the thin film according to some embodiments may be provided as a solution in which the Group 5 element precursor represented by the general formula (1) and/or the other precursor is dissolved in an organic solvent. In some embodiments, the organic solvent may include an ester (e.g., acetic ester), an ether, a ketone, a hydrocarbon (e.g., hydrocarbon including a cyano group), a pyridine, and/or a lutidine. The organic solvent may include, for example, at least one of Acetic esters such as Ethyl acetate, Butyl acetate, and Methoxyethyl acetate; Ethers such as Tetrahydrofuran, Tetrahydropyrane, Ethylene Glycol Dimethyl ether, Diethylene Glycol Dimethyl ether, Triethylene Glycol Dimethyl ether, Dibutyl ether, and Dioxane; Ketones such as Methyl butyl ketone, Methyl isobutyl ketone, Ethyl butyl ketone, Dipropyl ketone, Diisobutyl ketone, Methyl amyl ketone, Cyclohexanone, and Methyl cyclohexanone; Hydrocarbons such as Hexane, Cyclohexane, Methyl cyclohexane, Dimethyl cyclohexane, Ethyl cyclohexane, Heptane, Octane, Toluene, and Xylene; Hydrocarbons having a Cyano group such as 1-Cyanopropane, 1-Cyanobutane, 1-Cyanohexane, Cyanocyclohexane, Cyanobenzene, 1,3-Dicyanopropane, 1,4-Dicyanobutane, 1,6-Dicyanohexane, 1,4-Dicyanocyclohexane, and 1,4-Dicyanobenzene; Pyridine, Lutidine, and combinations thereof. The organic solvent may be used alone or as a mixed solution of two or more types, depending on relations of the solubility, the use temperature, the boiling point, the flash point and the like of the solute.

In the material for fabricating the thin film containing the organic solvent, the molar concentration of the Group 5 element precursor represented by the general formula (1) may be, for example, 0.01 M (mol/L) to 2.0 M, and preferably, 0.05 M to 1.0 M. Here, the molar concentration may be a mole number of the Group 5 element precursor (solute) represented by the general formula (1) with respect to 1 L of the material for fabricating the thin film (solution) including the organic solvent. When the material for fabricating the thin film further includes the other precursor, the mole number of the solute may be a total amount of the Group 5 element precursor represented by the general formula (1) and the other precursor.

The material for fabricating the thin film according to some embodiments may further include a nucleophilic reagent that imparts stability to the Group 5 element precursor represented by the general formula (1) and the other precursor.

The nucleophilic reagent may include, for example, at least one of Ethylene glycol ethers such as Glyme, Diglyme, Triglyme and Tetraglyme; Crown ethers such as 18-Crown-6, Dicyclohexyl-18-Crown-6, 24-Crown-8, Dicyclohexyl-24-Crown-8, and Dibenzo-24-Crown-8; chain Polyamines such as Ethylene diamine, N,N'-Tetramethylethylenediamine, Diethylenetriamine, Triethylenetetramine, Tetraethylenepentamine, Pentaethylenehexamine, 1,1,4,7,7-Pentamethyldiethylenetriamine, 1,1,4,7,10,10-Hexamethyltriethylenetetramine, and Triethoxytriethyleneamine; cyclic Polyamines such as Cyclam and Cyclen; Heterocycle compounds such as Pyridine, Pyrrolidine, Piperidine, Morpholine, N-methylpyrrolidine, N-methylpiperidine, N-methylmorpholine, Tetrahydrofurane, Tetrahydropyran, 1,4-dioxane, Oxazole, Thiazole and Oxathioran; β-Diketones such as Acetylacetone, 2,4-Hexanedione, 2,4-Heptanedione, 3,5-Heptanedione, Dipyvaloylmethane and combinations thereof. The material for fabricating the thin film according to some embodiments may include 0.1 to 10 mol of the nucleophilic reagent on the basis of the total amount of 1 mol. Preferably, the material for fabricating the thin film according to some embodiments may include 1 to 4 mol of the nucleophilic reagent on the basis of the total amount of 1 mol.

The material for fabricating the thin film according to sone embodiments may be provided by removing impurities such as metal impurities, halogen impurities (e.g., chlorine impurities), and organic impurities.

For example, the material for fabricating the thin film according to some embodiments may include metal impurities of 100 ppb or less for each element, and preferably, 10 ppb or less for each element. The total amount of metal impurities may be, for example, 1 ppm or less. When the material for fabricating the thin film according to some embodiments is used for a gate insulating film, a gate film, a barrier film, and the like, the content of a alkali metal element and an alkaline earth metal element that affect the electrical characteristic of the thin film may be reduced.

The material for fabricating the thin film according to some embodiments may include halogen impurities of 100 ppm or less, preferably 10 ppm or less, and more preferably 1 ppm or less.

The material for fabricating the thin film according to some embodiments may include organic impurities of 500 ppm or less, preferably 50 ppm or less, and more preferably 10 ppm or less.

The material for fabricating the thin film according to some embodiments may be provided by removing moisture to reduce or prevent the occurrence of particles during thin film fabrication. For example, in the material for fabricating the thin film according to some embodiments, the Group 5 element precursor represented by the general formula (1), the other precursor, the organic solvent and the nucleophilic reagent may each include moisture of 10 ppm and preferably 1 ppm or less.

The material for fabricating the thin film according to some embodiments may be provided by removing particles to reduce or prevent particle contamination of the thin film. For example, in the material for fabricating the thin film according to some embodiments, in measuring particles using a light scattering type submerged particle detector, the number of particles larger than 0.3 μm may be 100 or less in 1 mL of the liquid phase, preferably the number of particles larger than 0.2 μm may be 1000 or less in 1 mL of the liquid phase, and more preferably the number of particles larger than 0.2 μm may be 100 or less in 1 mL of the liquid phase.

Hereinafter, a method for fabricating a thin film according to some embodiments will be described with reference to examples and the drawings. However, these are merely examples, and the present inventive concept is not limited to these examples.

FIG. 1 is a flowchart for explaining a method for fabricating the thin film according to some embodiments of the present inventive concept.

Referring to FIG. 1, a method for fabricating a thin film according to some embodiments may include providing of a source including a Group 5 element precursor represented by the general formula (1) (Block Sa), and depositing of a thin film including the Group 5 element, using the source (Block Sb).

Providing of the source (Block Sa) may be performed, using various methods such as a gas transportation method and a liquid transportation method. For example, when the gas transportation method is used, the source may be provided as the Group 5 element precursor represented by the general formula (1) as it is. When the liquid transportation method is used, the source is provided in a state of solution or liquid in which the Group 5 element precursor represented by the general formula (1) and/or the other precursor is dissolved in an organic solvent. The source provided in the state of solution or liquid may be vaporized by being heated and/or depressurized in a vaporizer.

In some embodiments, vaporizing of the source may be performed at a temperature of 0° C. to 150° C. and a pressure of 1 Pa to 10,000 Pa.

Further, the providing of the source (Block Sa) may be provided by various methods such as a single source method and a cocktail source method. For example, when the single source method is used, the Group 5 element precursor represented by the general formula (1) may be provided by being vaporized independently of the other precursors. When the cocktail source method is used, the Group 5 element precursor represented by the general formula (1) is provided as a mixture with the above-mentioned other precursor or as a solution obtained by dissolving the above-mentioned mixture in the organic solvent.

As a thin film is deposited using the source (Block Sb), the Group 5 element thin film may be formed on the substrate. The Group 5 element thin film may include, for example, at least one of a niobium metal thin film, a niobium oxide thin film, a niobium nitride thin film, a niobium alloy, a niobium-containing complex oxide thin film, a tantalum metal thin film, a tantalum oxide thin film, a tantalum nitride thin film, a tantalum alloy, tantalum-containing complex oxide thin film and combinations thereof. The niobium alloy may include, for example, a niobium-hafnium (Nb—Hf) alloy or a niobium-titanium (Nb—Ti) alloy. The tantalum alloy may include, for example, tantalum-titanium (Nb—Ti) alloy or tantalum-tungsten (Ta—W) alloy.

The Group 5 element thin film may be used, for example, as an electrode material for a semiconductor memory element (for example, a DRAM element), a resistance film, a diamagnetic film of a hard disk, a catalyst material for a polymer fuel cell, or the like.

Depositing of the thin film using the source (Block Sb) may be performed, for example, by the use of a thermal CVD for depositing the source using heat, or for depositing a thin film by reacting the source with a reaction gas using heat, a plasma CVD using heat and plasma, an optical CVD using heat and light, an optical plasma CVD using heat, light and plasma, an ALD for performing deposition in a molecular level by stages, and combinations thereof.

In some embodiments, depositing of the thin film using the source (Block Sb) may be performed at a reaction temperature of 100° C. or higher. For example, depositing of the thin film using the source (Block Sb) may be performed at a reaction temperature of 150° C. to 500° C., and preferably 250° C. to 450° C. In such a case, the source including the Group 5 element precursor represented by the general formula (1) may have sufficient reactivity and may efficiently fabricate the thin film.

In some embodiments, depositing of the thin film using the source (Block Sb) may be performed at a reaction pressure of 10 Pa to atmospheric pressure (e.g., 101,325 Pa) when using the thermal CVD or the optical CVD. In some embodiments, depositing the thin film using the source (Block Sb) may be performed at a reaction pressure of 10 Pa to 2,000 Pa when using the plasma CVD or the optical plasma CVD.

In some embodiments, depositing of the thin film using the source (Block Sb) may be performed at a deposition rate of 0.01 nm/min to 100 nm/min, and preferably at a deposition rate of 1 nm/min to 50 nm/min. In such a case, the method for fabricating the thin film according to some embodiments may maintain the characteristics of the thin film fabricated with high productivity. In some embodiments, the deposition rate may be adjusted by the feeding conditions of the source (e.g., the vaporization temperature or the vaporization pressure), the reaction temperature, the reaction pressure, and the like.

Figure 2:
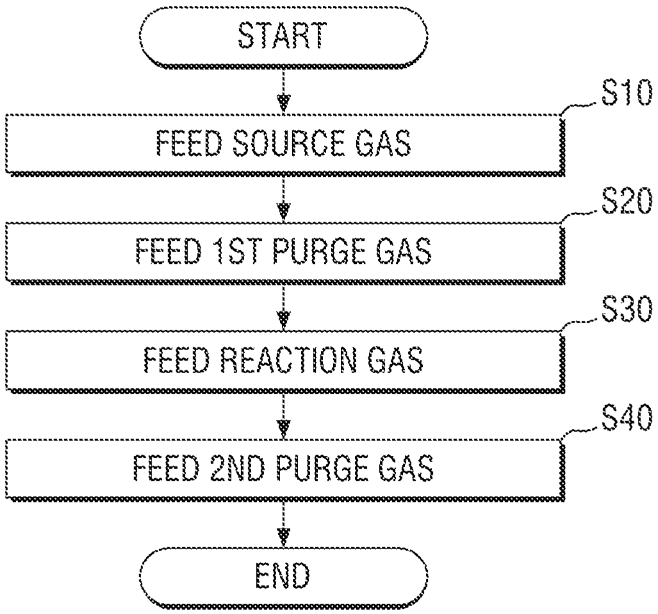
FIG. 2 is a flowchart for a method of fabricating a thin film using an ALD process according to some embodiments of the present inventive concept.

FIG. 2 is a flowchart for explaining the method for fabricating the thin film using ALD according to some embodiments of the present inventive concept. For the sake of convenience of description, repeated parts of contents explained above using FIG. 1 will be briefly described or omitted.

Referring to FIG. 2, the method for fabricating the thin film according to some embodiments may include feeding of a source gas onto the substrate (Block S10), feeding of a first purge gas (Block S20), feeding of a reaction gas (Block S30), and feeding of a second purge gas (Block S40).

The source gas may be a gas in which the source including the Group 5 element precursor represented by the general formula (1) is vaporized. The vaporizing of the source may be performed, for example, at a temperature of 0° C. to 150° C. and a pressure of 1 Pa to 10,000 Pa.

As the source gas is supplied (Block S10), a preliminary Group 5 element thin film including the Group 5 element may be formed on the substrate. The preliminary Group 5 element thin film may be a thin film generated from the Group 5 element precursor represented by the general formula (1), or a thin film generated by decomposition or reaction of a part of the Group 5 element thin film precursor represented by the general formula (1).

In some embodiments, feeding of the source gas (Block S10 may be performed at a temperature from room temperature to 500° C., and preferably 250° C. to 450° C. In some embodiments, feeding of the source gas (Block S10) may be performed at a pressure of 1 Pa to 10000 Pa, and preferably 10 Pa to 1000 Pa.

The first purge gas may include an inert gas such as nitrogen ($N_2$), helium (He) and argon (Ar). As the first purge gas is supplied (Block S20), the unreacted gas after forming the preliminary Group 5 element thin film may be exhausted.

In some embodiments, feeding of the first purge gas (Block S20) may be omitted. For example, the unreacted gas may be exhausted by utilizing the depressurization. The depressurization pressure may be, for example, 0.01 Pa to 300 Pa, and preferably 0.01 Pa to 100 Pa.

The reaction gas may include, for example, at least one of an oxidizing gas, a reducing gas, a nitriding gas, a carbonizing gas, and a combination thereof. The oxidizing gas may include, for example, at least one of oxygen ($O_2$), ozone ($O_3$), oxygen radical (O), nitrogen dioxide ($NO_2$), nitrogen monoxide (NO), nitrous oxide ($N_2O$), water vapor ($H_2O$), hydrogen peroxide ($H_2O_2$), formic acid, acetic acid, acetic anhydride, and combinations thereof. The reducing gas may include, for example, hydrogen ($H_2$). The nitriding gas may include, for example, at least one of an organic amine compound such as monoalkylamine, dialkylamine, trialkylamine, and alkyleneamine; nitrogen ($N_2$), ammonia ($NH_3$), nitrogen radical (N), nitrous oxide ($N_2O$), hydrazine (e.g., Methyl hydrazine), and combinations thereof. The carbonizing gas may include, for example, at least one of carbon monoxide (CO), carbon dioxide ($CO_2$), cyclic alkane, alkane having 1 to 12 carbon atoms, and alkene having 1 to 12 carbon atoms, an alkyne having 1 to 12 carbon atoms, and combinations thereof.

As the reaction gas is supplied (Block S30), a Group 5 element thin film may be formed on the substrate from the preliminary Group 5 element thin film.

For example, when the source gas does not include other metal compounds or non-metal compounds except for the Group 5 element precursor represented by the general formula (1), a metal film including only the Group 5 element may be formed.

For example, when the reaction gas includes an oxidizing gas, a metal oxide (i.e., a Group 5 element oxide) thin film may be formed.

For example, when the reaction gas includes a nitriding gas, a metal nitride (i.e., Group 5 element nitride) thin film may be formed.

Since the source gas including the Group 5 element precursor represented by the general formula (1) has excellent reactivity with the reaction gas, a high-quality Group 5 element thin film having low impurity content (for example, a residual carbon content) can be formed.

In some embodiments, the reaction gas may include an oxidizing gas, and preferably ozone ($O_3$) or water vapor ($H_2O$). In such a case, the source gas including the Group 5 element precursor represented by the general formula (1) may have an advantage of reacting with the reaction gas even at a low temperature.

In some embodiments, the reaction gas may include hydrogen ($H_2$), ammonia ($NH_3$), ozone ($O_3$) or water vapor ($H_2O$), and preferably ammonia ($NH_3$) or wat-r vapor ($H_2O$). In such a case, since the thickness of the thin film fabricated per cycle of ALD s thick, there may be an advantage of excellent productivity.

The second purge gas may include an inert gas such as nitrogen ($N_2$), helium (He), and argon (Ar). As the second purge gas is supplied (Block S40), the unreacted gas after forming the Group 5 element thin film may be exhausted.

In some embodiments, the feeding of the reaction gas (Block S30) may be performed at a temperature of room temperature to 500° C., and preferably 250° C. to 450° C. In some embodiments, the feeding of the reaction gas (Block S30) may be performed at a pressure of 1 Pa to 10,000 Pa, and preferably 10 Pa to 1,000 Pa.

In some embodiments, feeding of the second purge gas (Block S40) may be omitted. For example, the unreacted gas may be exhausted by utilizing the depressurization. The depressurization pressure may be, for example, 0.01 Pa to 300 Pa, and preferably 0.01 Pa to 100 Pa.

In the method for fabricating the thin film according to some embodiments, the Blocks S10 to S40 described above may form one cycle (1 cycle), and may be repeated until the Group 5 element thin film is formed to have a predetermined thickness.

In the method for fabricating the thin film according to some embodiments, energy such as plasma, light, and voltage and/or a catalyst may be further used. The use of energy and/or a catalyst may be performed, for example, simultaneously with the Blocks S10 to S40 described above or may be performed between the Blocks S10 to S40.

In the method for fabricating the thin film according to some embodiments, an annealing process may be further performed. The annealing process may be performed, for example, in an oxidizing atmosphere or a reducing atmosphere.

In the method for fabricating the thin film according to some embodiments, a reflow process may be further performed. The reflow process may be performed, for example, at a temperature of 200° C. to 1,000° C., and preferably 250° C. to 500° C.

Hereinafter, equipment for fabricating the thin film according to some embodiments will be described with reference to the examples and the drawings. However, these are merely examples, and the present inventive concept is not limited to these exam les.

FIGS. 3 to 6 are schematic views of equipment for fabricating the thin film according to some embodiments of the present inventive concept. For convenience of description, repeated parts of contents explained above using FIGS. 1 and 2 will be briefly described or omitted.

Figure 3:
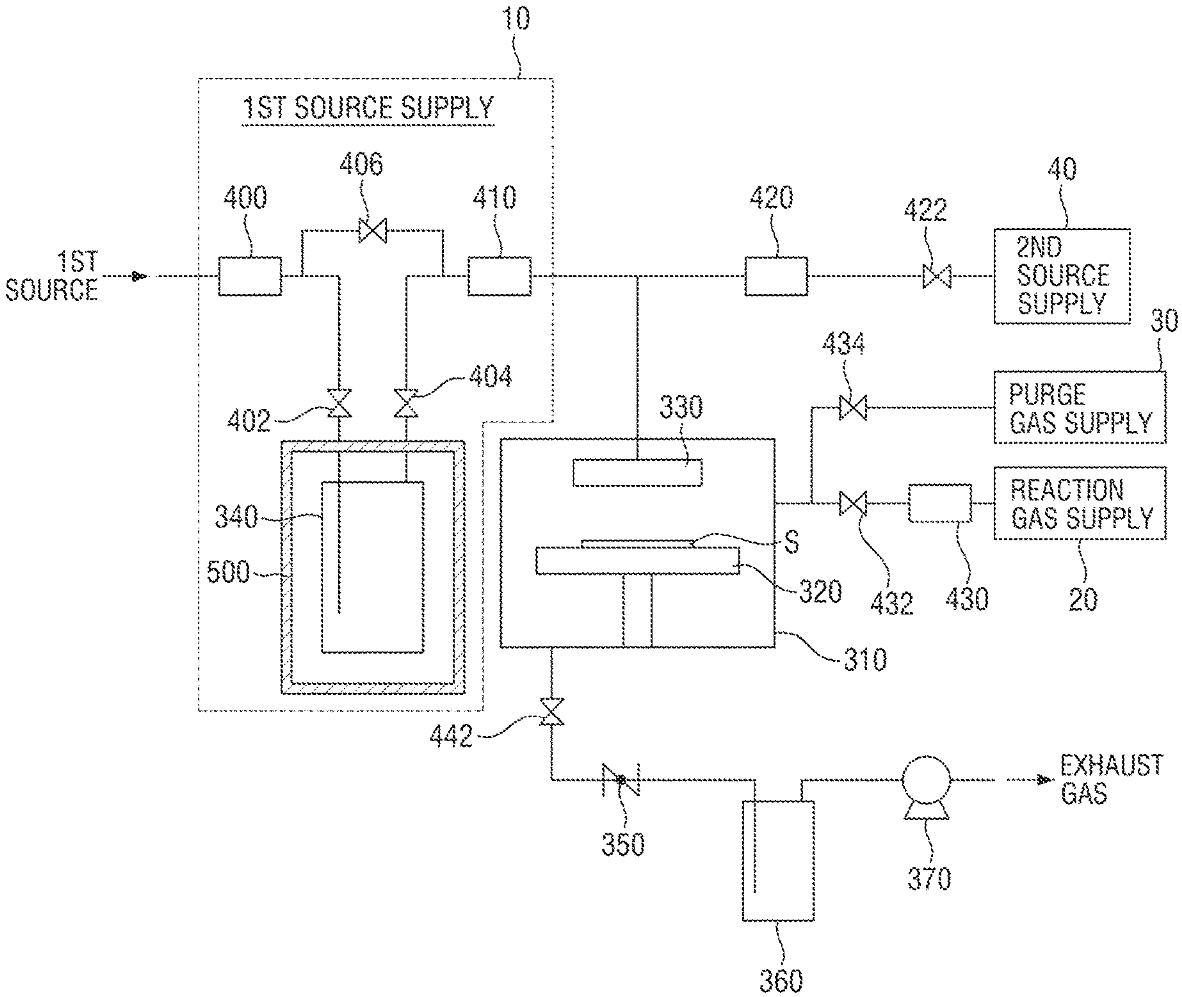
FIGS. 3 to 6 are schematic views illustrating equipment that can be used for fabricating a thin film according to some embodiments of the present inventive concept.

Referring to FIG. 3, the equipment for fabricating the thin film according to some embodiments may include a chamber 310, a substrate pedestal 320, a gas injection unit 330, a first source supply 10, and a reaction gas supply 20, a purge gas supply 30 and an exhaust unit 370.

The chamber 310 may have, for example, a cylindrical shape with a reaction space. The substrate pedestal 320 may be disposed in the chamber 310 and may receive the substrate S thereon. The substrate pedestal 320 may be fixed to a lower part of the chamber 310 or may be elevated and/or rotated within the chamber 310 if desired. Although not shown, the substrate pedestal 320 may include various devices for placing the substrate S on an upper surface thereof. For example, the substrate pedestal 320 may include a plurality of lift pin units for loading and unloading the substrate S.

The substrate S may include, for example, at least one of silicon (Si); ceramics such as SiN, TiN, TaN, SiO, NbO, ZrO, HfO, and LaO; glass; metal such as metallic cobalt and combinations thereof. In addition, the substrate S may have, for example, a plate shape, a sphere shape, a fiber shape or a scale shape. Also, the substrate S may be formed as a flat plate or may be formed as a three-dimensional structure including a trench.

The gas injection unit 330 may be disposed in the chamber 310 and may inject gas into the chamber 310. For example, the gas injection unit 330 may be connected to a first source supply 10 and a second source supply 40 to be described later. The gas injection unit 330 may be fixed to the upper part of the chamber 310 or may be elevated and/or rotated in the chamber 310 if desired.

The first source supply 10 may be connected to the chamber 310 to provide a first source into the chamber 310. The first source may include the Group 5 element precursor represented by the general formula (1).

In some embodiments, the first source supply 10 may provide the first source in the bubbling form. For example, the first source supply 10 may include a source container 340 and a heater 500. The first source may be provided in the source container 340 in a state of solution or liquid. The heater 500 may heat the source container 340 to convert the first source into the bubbling form. In some embodiments, converting of the first source may be performed at a temperature of 0° C. to 150° C. and a pressure of 1 Pa to 10,000 Pa. The first source may be converted into the bubbling form and provided to the chamber 310.

The first source in the state of solution or liquid may be con rolled by, for example, a first mass flow controller 400 and a first valve 402, and may be provided to the source container 340. The first source converted into the bubbling form may be controlled by a second valve 404 and a second mass flow controller 410, and may be provided to the chamber 310. In some embodiments, a third valve 406 may be disposed between the first mass flow controller 400 and the second mass flow controller 410 to control the flow of the first source.

The reaction gas supply 20 may be connected to the chamber 310 to provide a reaction gas into the chamber 310. The reaction gas may include at least one of the above-described oxidizing gas, reducing gas, nitriding gas, carbonizing gas, and a combination thereof. The reaction gas is controlled by, for example, a third mass flow controller 430 and a fourth valve 432, and may be provided to the chamber 310.

The purge gas supply 30 may be connected to the chamber 310 to provide the purge gas into the chamber 310. The purge gas may include an inert gas such as nitrogen ($N_2$), helium (He) and argon (Ar). The purge gas may be controlled by, for example, a fifth valve 434, and may be provided to the chamber 310.

The exhaust unit 370 may be connected to the chamber 310 and may exhaust the exhaust gas such as impurities and reaction byproducts in the chamber 310. Further, the exhaust unit 370 may form and maintain a vacuum state inside the chamber 310. The exhaust unit 370 may be, for example, a pump. The exhaust gas may be controlled by, for example, the sixth valve 442, and may be provided to the exhaust unit 370.

In some embodiments, an automatic pressure controller 350 may be further disposed. The automatic pressure controller 350 may be disposed, for example, between the chamber 310 and the exhaust unit 370. The automatic pressure controller 350 may adjust the pressure inside the chamber 310.

In some embodiments, a cooling container 360 may be further disposed. The cooling container 360 may be disposed, for example, between the chamber 310 and the exhaust unit 370. The cooling container 360 may cool the exhaust gas. For example, the exhaust gas may be provided to the exhaust unit 370 in the state of solution or liquid by the cooling container 360.

In some embodiments, a second source supply 40 may be further disposed. The second source supply 40 may be connected to the chamber 310 to provide a second source into the chamber 310. The second source may contain other metal compound or non-metal compound (hereinafter, referred to as "other precursor") other than the Group 5 element precursor represented by the general formula (1).

The above-mentioned other precursors may include compounds of one kind or two kind or more organic compounds selected from compounds used as organic ligands such as Alcohol compounds, Glycol compounds, β-Diketone compounds or Cyclopentadiene compounds, organic Amine compounds and combinations thereof, and a combination of silicon (Si) or metal.

The second source may be controlled by, for example, a seventh valve 422 and a fourth mass flow controller 420, and may be provided to the chamber 310.

Figure 4:
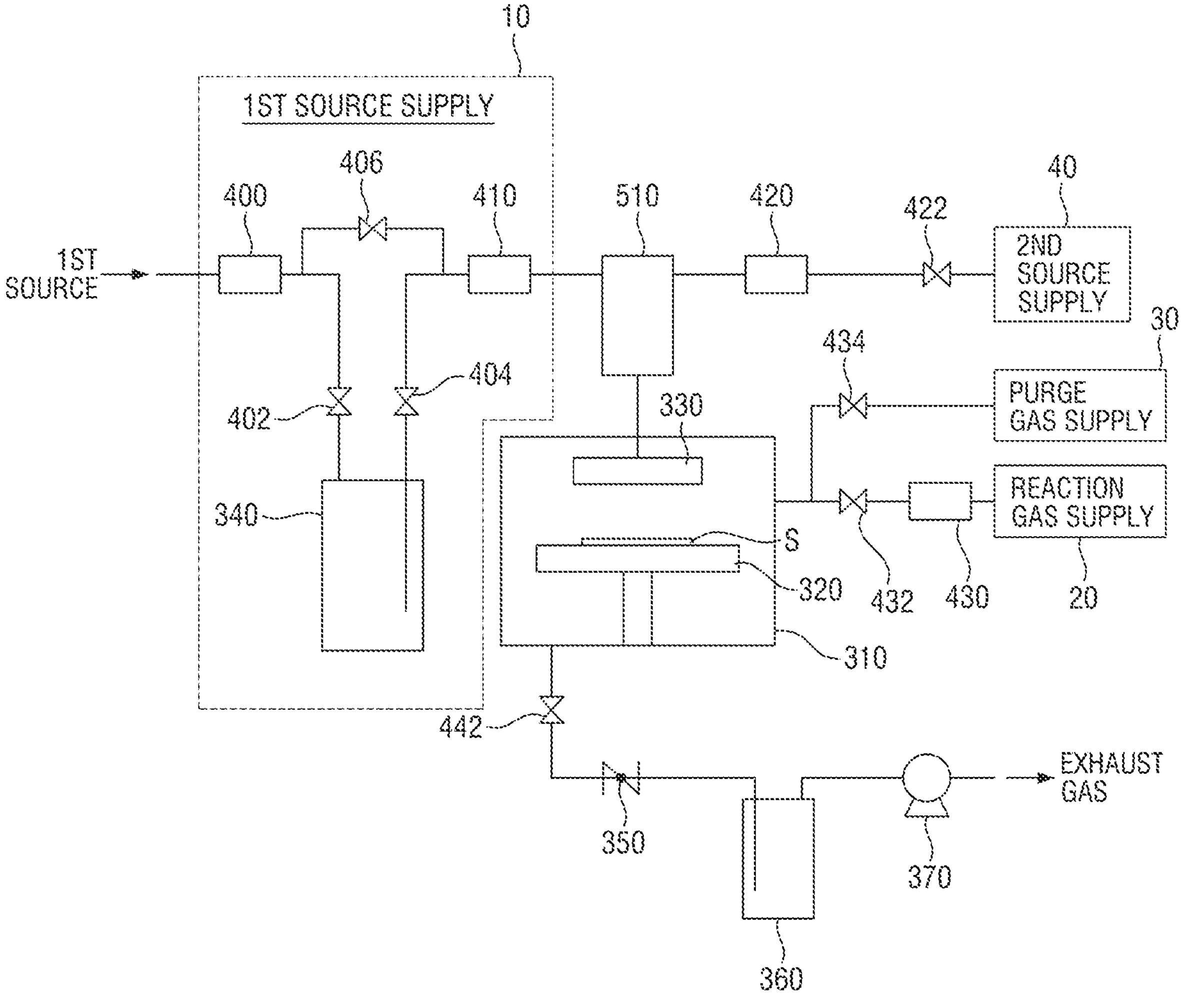

Referring to FIG. 4, the equipment for fabricating the thin film according to some embodiments may include a vaporizer 510. For the sake of convenience, of description, repeated parts of contents explained above with reference to FIG. 3 will be briefly described or omitted.

The vaporizer 510 may be disposed between the chamber 210 and the first source supply 10. The vaporizer 510 may provide the first source in a gaseous state. For example, the vaporizer 510 may vaporize the first source of the state of solution or liquid by heating and/or depressurizing. In some embodiments, vaporizing of the first source may be performed at a temperature of 0° C. to 150° C. and a pressure of 1 Pa to 10,000 Pa. The first source may be converted into a gas state and provided to the chamber 310.

In some embodiments, the vaporizer 510 may also be disposed between the chamber 310 and the second source supply 40. The vaporizer 510 may provide the second source in a gaseous state.

Figure 5:
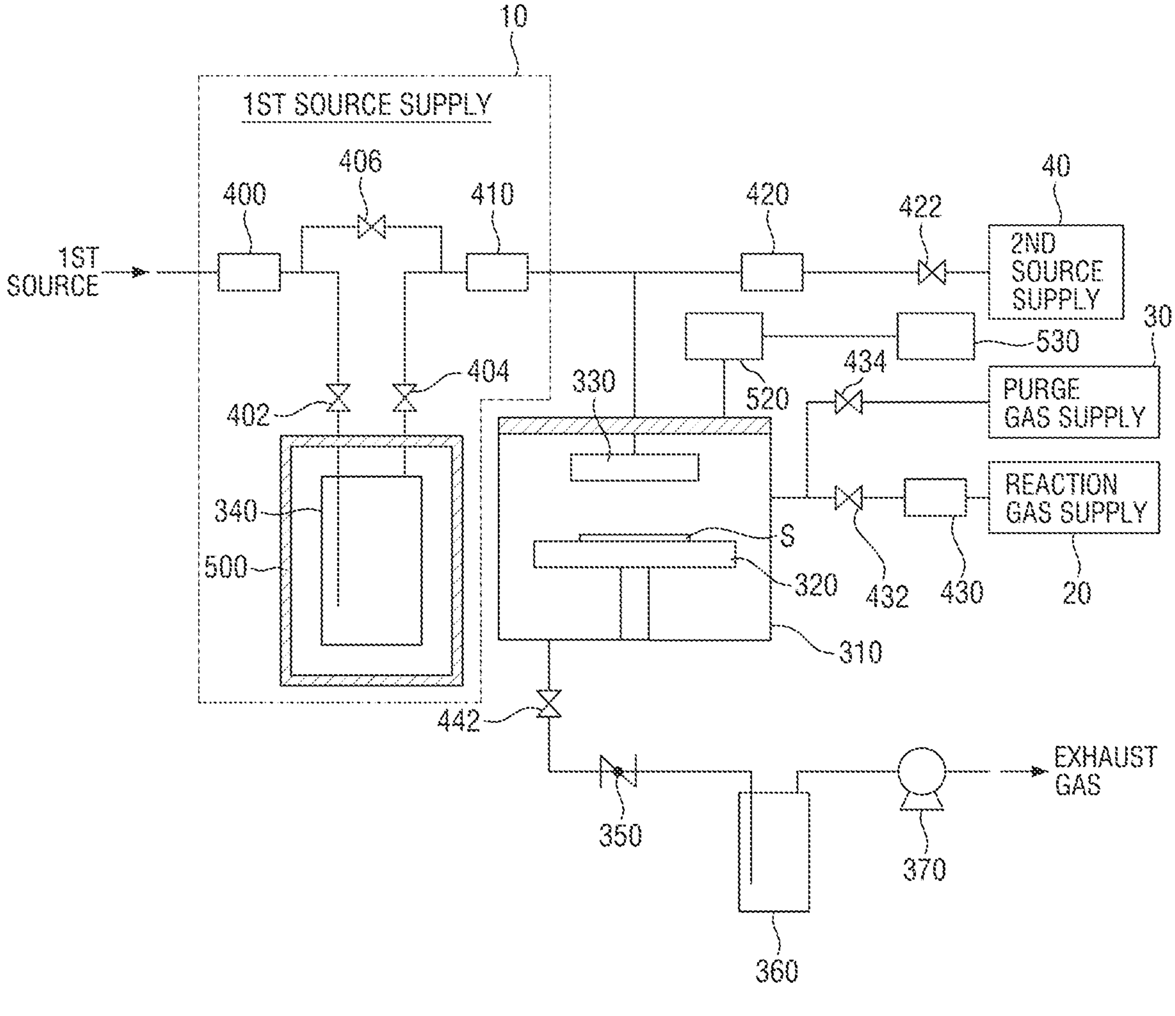

Referring to FIG. 5, the equipment for fabricating the thin film according to some embodiments may include plasma generators 520 and 530. For the sake of convenience of description, repeated parts of contents explained above with reference to FIG. 3 will be briefly described or omitted.

The plasma generators 520 and 530 may include, for example, a plasma control system 520 and a power supply 530. The power supply 530 may provide, for example, an alternating current (RF) power supply. The plasma control system 520 may generate plasma in the chamber 310, using an AC power source provided from the power source 530. The plasma generators 520 and 530 may perform, for example, a plasma treatment on the first source, the second source and/or the reactive gas.

Figure 6:
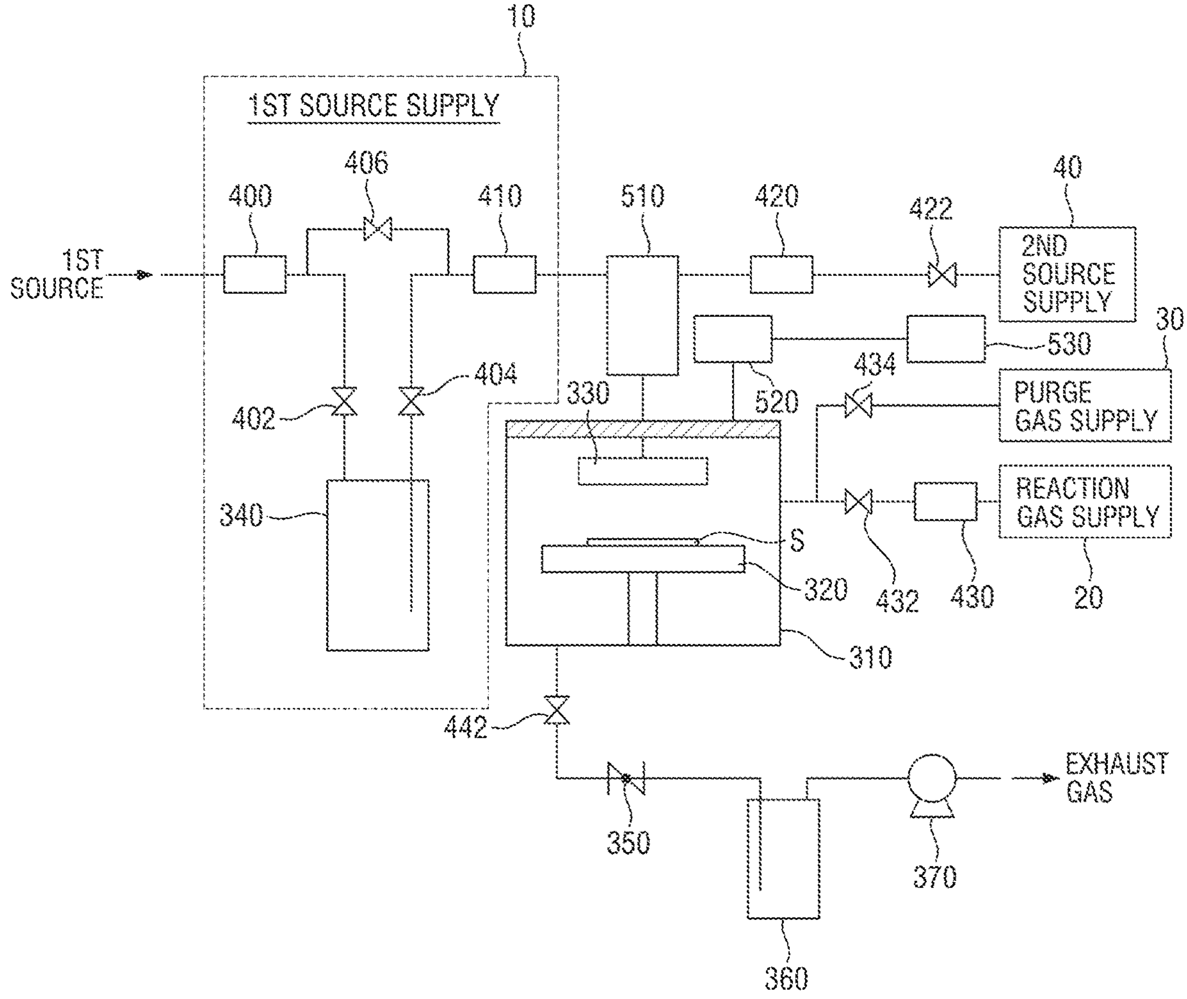

Referring to FIG. 6, the equipment for fabricating the thin film according to some embodiments may include a vaporizer 510. For the sake of convenience of description, repeated parts of contents explained above with reference to FIG. 5 will be briefly described or omitted.

Since the vaporizer 510 is similar to that described above with reference to FIG. 4, detailed description thereof will be omitted.

Hereinafter, the present inventive concept will be described more specifically with reference to examples, fabricating examples and Comparative examples. The following examples are only for explaining the technical idea of the present disclosure, and the present inventive concept is not limited thereto.

[Fabricating Example 5]—Niobium Nitride Thin Film

Niobium nitride (NbN) thin film was fabricated on a silicon (Si) substrate, by using compound No. 11, compound No. 16 (Fabricating example 1), compound No. 31 (Fabricating example 2), compound No. 51 (Fabricating example 3), Comparative example 1 and Comparative example 2 as the aforementioned first source. For fabricating the niobium nitride thin film, the method for fabricating the thin film described above with reference to FIG. 2 and the equipment for fabricating the thin film described above with reference to FIG. 3 were used.

Specifically, the aforementioned Blocks S10 to S40 were set as one cycle (1 cycle), and 150 cycles were performed. Each Blocks S10 to S40 was performed as follows.

A step of feeding source gas (Block S10): The temperature of the source container 340 was heated to 90° C. under a pressure condition of 100 Pa to vaporize the first source. The first source vaporized under the pressure condition of 100 Pa was deposited on the substrate S in the chamber 310 for 30 seconds.

A step of feeding of the first purge gas (Block S20): Argon (Ar) was fed into the chamber 310 to exhaust unreacted gas.

A step of feeding the reaction gas (Block S30): The temperature of the substrate S was heated to 300° C. under the pressure condition of 100 Pa, and ammonia ($NH_3$) gas was fed into the chamber 310 to make it react with the preliminary Group 5 element thin film for 30 seconds.

A step of feeding the second purge gas (Block S40): Argon (Ar) was fed into the chamber 310 to exhaust unreacted gas.

[Evaluation of Fabricating Example 5]

It was confirmed that the fabricated thin film was niobium nitride, and the thickness and carbon content of the niobium nitride thin film were measured and shown in Table 3. The fabricated thin film was confirmed using an X-ray diffraction method. The thickness of the thin film was measured using an X-ray reflectivity method. The carbon content of the thin film was measured using an X-ray photoelectron spectroscopy.

TABLE 3

| Source | Fabricated thin film | Thickness of thin film (Nm) | Carbon content of thin film (atm %) |
|---|---|---|---|
| No. 11 | NbN | 8 | Not detected |
| No. 16 | NbN | 9 | Not detected |
| No. 31 | NbN | 5 | Not detected |
| No. 51 | NbN | 5 | Not detected |
| Comparative example 1 | NbN | 2 | 8 |
| Comparative example 2 | NbN | — | — |

As shown in Table 3 above, it is possible to know that the thickness of the niobium nitride thin film fabricated using compound No. 11, compound No. 16 (Fabricating example 1), compound No. 31 (Fabricating example 2) and compound No. 51 (Fabricating example 3) is 5 nm or more, and the productivity is much higher than that of the niobium nitride thin film fabricated using the Comparative example 1 and Comparative example 2. In particular, it is possible to know that the thickness of the niobium nitride thin film fabricated using the compound No. 11 and the compound No. 16 is 8 nm or more, and the productivity is further excellent.

Further, as shown in Table 3 above, the carbon content was n t detected in the niobium nitride thin film fabricated using compound No. 11, compound No. 16 (Fabricating example 1), compound No. 31 (Fabricating example 2) and compound No. 51 (Fabricating example 3). A detection limit of the X-ray photoelectron spectroscopy used for measuring the carbon content was 0.1 atm %. That is, the carbon content of the niobium nitride thin film fabricated according to some examples is less than 0.1 atm %, and it is possible to know that the quality is much better than that of the niobium nitride thin film fabricated using Comparative example 1. In the case of Comparative example 2 described above, a thin film could not be formed due to decomposition.

[Fabricating Example 6]—Niobium Oxide Thin Film

Niobium oxide (NbO) thin film was fabricated on a silicon (Si) substrate, using compound No. 11, compound No. 16 (Fabricating example 1), compound No. 31 (Fabricating example 2), compound No. 51 (Fabricating example 3), Comparative example 1 and Comparative example 2 as the first source. For fabricating the niobium oxide thin film, the method for fabricating the thin film described above with reference to FIG. 2, and the equipment for fabricating the thin film described above with reference to FIG. 3 were used.

Specifically, in the Block S30 of feeding the reaction gas, the Blocks S10 to S40 were performed in the same manner as in Fabricating example 5, except that the temperature of the substrate S was heated to 250° C. and the ozone ($O_3$) gas was fed into the chamber 310.

[Evaluation of Fabricating Example 6]

It was confirmed that the fabricated thin film was niobium oxide, and the thickness and carbon content of the niobium oxide thin film were measured and show in Table 4 below. The evaluation of Fabricating example 6 was performed in the same manner as the evaluation of Fabricating example 5 described above.

TABLE 4

| Source | Fabricated thin film | Thickness of thin film (Nm) | Carbon content of thin film (atm %) |
|---|---|---|---|
| No. 11 | NbO | 6 | Not detected |
| No. 16 | NbO | 8 | Not detected |
| No. 31 | NbO | 5 | Not detected |
| No. 51 | NbO | 5 | Not detected |
| Comparative example 1 | NbO | 2 | 6 |
| Comparative example 2 | NbO | — | — |

As shown in Table 4 above, it is possible to know that the thickness of the niobium oxide thin film fabricated using compound No. 11, compound No. 16 (Fabricating example 1), compound No. 31 (Fabricating example 2) and compound No. 51 (Fabricating example 3) is 5 nm or more, and the productivity is much better than that of the niobium oxide thin films fabricated using the Comparative example 1 and the Comparative example 2. In particular, it is possible to know that the thickness of the niobium oxide thin film fabricated using the compound No. 11 and the compound No. 16 is 6 nm or more, and the productivity s further excellent.

Further, as shown in Table 4 above, the carbon content was n t detected in the niobium oxide thin film fabricated using compound No. 11, compound No. 16 (Fabricating example 1), compound No. 31 (Fabricating example 2) and compound No. 51 (Fabricating example 3). The detection limit of the X-ray photoelectron spectroscopy used for measuring the carbon content was 0.1 atm %. That is, the carbon content of the niobium oxide thin film fabricated according to some examples is less than 0.1 atm %, and it is possible to know that quality is much superior to the niobium oxide thin film fabricated using Comparative example 1. In the case of Comparative example 2 described above, a thin film could not be formed due to decomposition.

In concluding the detailed description, those skilled in the art will appreciate that many variations and modifications may be made to example embodiments without substantially departing from the present inventive concept. Therefore, the example embodiments provided herein are generic and descriptive and are not provided for purposes of limitation.

What is claimed is:

1. A material comprising a Group 5 element precursor of formula (1):

(1)

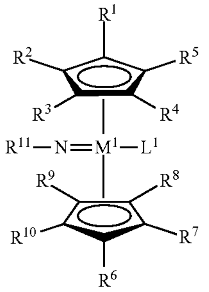

wherein $M^1$ is a Group 5 element, each of $R^1$ and $R^6$ is a substituted or unsubstituted alkyl group having 1 to 5 carbon atoms, $R^2$ to $R^5$ and $R^7$ to $R^{10}$ is a hydrogen atom, $R^{11}$ is a substituted or unsubstituted isopropyl group, isobutyl group, sec-butyl group, tert-butyl group, isopentyl group, sec-pentyl group, or tert-pentyl group, $L^1$ is an alkyl group, an alkylamino group, an alkoxy group or an alkylsilyl group, each of which has 1 to 5 carbon atoms and is substituted or unsubstituted.

2. The material of claim 1, wherein $M^1$ is vanadium (V), niobium (Nb) or tantalum (Ta).

3. The material of claim 1, wherein $L^1$ has a structure of formula (3), formula (4) or formula (5):

(3)

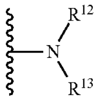

(4)

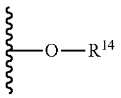

(6)

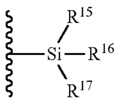

each of $R^{12}$ to $R^{17}$ independently is a substituted or unsubstituted alkyl group having 1 to 5 carbon atoms.

4. The material of claim 1, wherein each of $R^1$ and $R^6$ independently is a methyl group or an ethyl group.

5. The material of claim 1, wherein $L^1$ is a methyl group.

6. The material of claim 1, wherein a thermal decomposition initiation temperature of the material is 300° C. or higher.

7. The material of claim 1, wherein a melting point of the material is 27° C. or lower.

8. The material of claim 1, further comprising an organic solvent including an ester, ether, ketone, hydrocarbon, pyridine, and/or lutidine.

9. The material of claim 1, wherein a molar concentration of the Group 5 element precursor of formula (1) in the material is 0.01 M to 2.0 M.

10. The material of claim 1, further comprising a nucleophilic reagent including ethylene glycol ether, crown ether, chain polyamine, cyclic polyamine, heterocycle compound, and/or β-diketone.

11. A material comprising a Group 5 element precursor of formula (1):

(1)

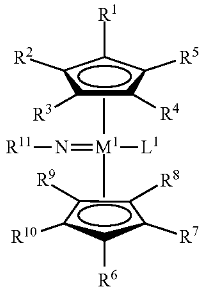

wherein:

$M^1$ is a Group 5 element;

all of $R^1$ to $R^{10}$ are methyl groups;

$R^{11}$ is an isopropyl group, a sec-butyl group, a tert-butyl group or a tert-pentyl group; and $L^1$ is a substituted or unsubstituted alkyl group having 1 to 5 carbon atoms or has a structure of formula (2), formula (3) or formula (4):

(2)

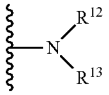

(3)

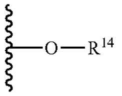

(4)

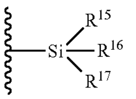

$R^{12}$ to $R^{17}$ are each independently a substituted or unsubstituted alkyl group having 1 to 5 carbon atoms.

12. The material of claim 11, wherein $M^1$ is niobium (Nb).

13. The material of claim 11, wherein $L^1$ is a methyl group.

14. The material of claim 11, wherein a thermal decomposition initiation temperature of the material is 350° C. or higher.

15. A method of fabricating a thin film, the method comprising:

providing a material including a Group 5 element precursor of formula (1) onto a substrate; and forming a thin film including a Group 5 element on the substrate using the material, wherein formula (1) is (1)

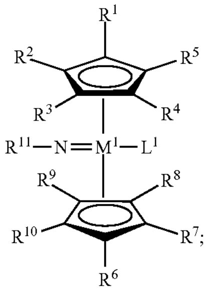

$M^1$ is a Group 5 element;

each of $R^1$ and $R^6$ is a substituted or unsubstituted alkyl group having 1 to 5 carbon atoms;

$R^2$ to $R^5$ and $R^7$ to $R^{10}$ is a hydrogen atom;

$R^{11}$ is a substituted or unsubstituted isopropyl group, isobutyl group, sec-butyl group, tert-butyl group, isopentyl group, sec-pentyl group, or tert-pentyl group; and $L^1$ is an alkyl group, an alkylamino group, an alkoxy group or an alkylsilyl group, each of which has 1 to 5 carbon atoms and is substituted or unsubstituted.

* * * * *